(12) United States Patent
Forbes et al.

(10) Patent No.: US 7,164,294 B2
(45) Date of Patent: Jan. 16, 2007

(54) METHOD FOR FORMING PROGRAMMABLE LOGIC ARRAYS USING VERTICAL GATE TRANSISTORS

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 43 days.

(21) Appl. No.: 10/929,831

(22) Filed: Aug. 30, 2004

(65) Prior Publication Data

US 2005/0029545 A1 Feb. 10, 2005

Related U.S. Application Data

(62) Division of application No. 10/185,155, filed on Jun. 28, 2002, now Pat. No. 6,794,246, which is a division of application No. 09/643,296, filed on Aug. 22, 2000, now Pat. No. 6,437,389.

(51) Int. Cl.
    G11C 8/00      (2006.01)
    H03K 19/084    (2006.01)
    G06F 7/38      (2006.01)
    H01L 29/76     (2006.01)

(52) U.S. Cl. .......................... 326/107; 326/38; 326/40; 326/41; 326/47; 326/102; 257/302; 257/314; 257/315

(58) Field of Classification Search ................. 326/107
    See application file for complete search history.

(56) References Cited

U.S. PATENT DOCUMENTS

| | | | |
|---|---|---|---|
| 4,622,648 A | * | 11/1986 | Whitaker ..................... 326/113 |
| 4,864,375 A | | 9/1989 | Teng et al. ................. 357/23.6 |
| 4,896,293 A | | 1/1990 | McElroy ..................... 257/297 |
| 4,926,224 A | | 5/1990 | Redwine ..................... 257/302 |
| 5,006,909 A | | 4/1991 | Kosa ........................ 357/23.6 |
| 5,010,386 A | | 4/1991 | Groover, III ................. 357/42 |
| 5,460,988 A | | 10/1995 | Hong ........................... 437/43 |
| 5,495,441 A | * | 2/1996 | Hong .................... 365/185.01 |
| 5,661,055 A | * | 8/1997 | Hsu et al. .................... 438/259 |
| 5,691,230 A | | 11/1997 | Forbes ........................ 437/62 |
| 5,696,008 A | | 12/1997 | Tamaki et al. ................ 437/40 |
| 5,847,425 A | * | 12/1998 | Yuan et al. .................. 257/315 |

(Continued)

OTHER PUBLICATIONS

Hergenrother, J. M., "The Vertical Replacement-Gate (VRG) MOSFET: A 50nm Vertical MOSFET with Lithography-Independent Gate Length", *IEEE*, (1999),pp. 75-78.

(Continued)

*Primary Examiner*—Rexford Barnie
*Assistant Examiner*—Dylan White
(74) *Attorney, Agent, or Firm*—Schwegman, Lundberg, Woessner & Kluth, P.A.

(57) ABSTRACT

One aspect disclosed herein relates to a method for forming a programmable logic array. Various embodiments of the method include forming a first logic plane and a second logic plane, each including a plurality of logic cells interconnected to implement a logical function. Forming the logic cells includes forming a horizontal substrate with a source region, a drain region, and a depletion mode channel region separating the source and the drain regions, and further includes forming a number of vertical gates located above different portions of the depletion mode channel region. At least one vertical gate is separated from the depletion mode channel region by a first oxide thickness, and at least one of the vertical gates is separated from the depletion mode channel region by a second oxide thickness. Other aspects and embodiments are provided herein.

39 Claims, 13 Drawing Sheets

U.S. PATENT DOCUMENTS

| | | | |
|---|---|---|---|
| 5,874,760 A | 2/1999 | Burns, Jr. et al. | 257/315 |
| 5,936,274 A | 8/1999 | Forbes et al. | 257/315 |
| 5,952,039 A | 9/1999 | Hong | 427/79 |
| 5,973,352 A | 10/1999 | Noble | 257/315 |
| 5,973,356 A | 10/1999 | Noble et al. | 257/319 |
| 5,991,225 A | 11/1999 | Forbes et al. | 365/230.06 |
| 6,034,389 A | 3/2000 | Burns et al. | 257/301 |
| 6,072,209 A | 6/2000 | Noble et al. | 257/296 |
| 6,083,793 A | 7/2000 | Wu | 438/270 |
| 6,114,725 A | 9/2000 | Furukawa et al. | 257/330 |
| 6,124,729 A | 9/2000 | Noble et al. | 326/41 |
| 6,134,175 A | 10/2000 | Forbes et al. | 365/230.06 |
| 6,143,636 A | 11/2000 | Forbes et al. | 438/587 |
| 6,150,687 A | 11/2000 | Noble et al. | 257/302 |
| 6,153,468 A | 11/2000 | Forbes et al. | 438/257 |
| 6,174,784 B1 | 1/2001 | Forbes | 438/405 |
| 6,184,549 B1 | 2/2001 | Furukawa et al. | 257/302 |
| 6,208,164 B1 * | 3/2001 | Noble et al. | 326/41 |
| 6,219,299 B1 | 4/2001 | Forbes et al. | 365/230.06 |
| 6,222,788 B1 * | 4/2001 | Forbes et al. | 365/230.06 |
| 6,238,976 B1 | 5/2001 | Noble et al. | 438/259 |
| 6,252,267 B1 | 6/2001 | Noble, Jr. | 257/296 |
| 6,281,054 B1 | 8/2001 | Yeo | 438/149 |
| 6,377,070 B1 | 4/2002 | Forbes | 326/41 |
| 6,403,494 B1 | 6/2002 | Chu et al. | 438/719 |
| 6,420,902 B1 * | 7/2002 | Forbes et al. | 326/39 |
| 6,424,001 B1 | 7/2002 | Forbes et al. | 257/315 |
| 6,437,389 B1 * | 8/2002 | Forbes et al. | 257/302 |
| 6,744,082 B1 * | 6/2004 | Forbes et al. | 257/213 |
| 2002/0109138 A1 | 8/2002 | Forbes | 257/51 |

OTHER PUBLICATIONS

Kalavade, Pranav, et al., "A novel sub-10 nm transistor", *58th DRC. Device Research Conference. Conference Digest*, (Jun. 19-21, 2000),71-72.

Xuan, Peiqi, et al., "60nm Planarized Ultra-thin Body Solid Phase Epitaxy MOSFETs", *IEEE Device Research Conference, Conference Digest. 58th DRC.* (Jun. 19-21, 2000),67-68.

* cited by examiner

METHOD FOR FORMING PROGRAMMABLE LOGIC ARRAYS USING VERTICAL GATE TRANSISTORS

CROSS REFERENCE TO RELATED APPLICATIONS

This application is a Divisional of U.S. Ser. No. 10/185,155 filed Jun. 28, 2002 is now a U.S. Pat. No. 6,794,246, which is a Divisional of U.S. Ser. No. 09/643,296 filed on Aug. 22, 2000, now issued as U.S. Pat. No. 6,437,389, which applications are incorporated herein by reference.

This application is related to the following co-pending, commonly assigned U.S. patent applications: entitled "Static Pass Transistor Logic with Transistors with Multiple Vertical Gates," Ser. No. 09/580,901; and "Vertical Gate Transistors in Pass Transistor Logic Decode Circuits," Ser. No. 09/580,860, both filed on May 30, 2000 and which disclosures are herein incorporated by reference.

TECHNICAL FIELD OF THE INVENTION

This invention relates generally to integrated circuits and in particular to vertical gate transistors in pass transistor programmable logic arrays.

BACKGROUND OF THE INVENTION

Many programmable logic arrays include multiple transistors arrayed such that a combination of activated transistors produce a logical function. Such transistors in the array are activated, in the case of MOSFET devices, by either applying or not applying a potential to the gate of the MOSFET. This action either turns on the transistor or turns off the transistor. Conventionally, each logical input to the programmable logic array is applied to an independent MOSFET gate. Thus, according to the prior art, a full MOSFET is required for each input to the programmable logic array. Requiring a full MOSFET for each logic input consumes a significant amount of chip surface area. Conventionally, the size of each full MOSFET, e.g. the space it occupies, is determined by the minimum lithographic feature dimension. Thus, the number of logical functions that can be performed by a given programmable logic array is dependent upon the number of logical inputs which is dependent upon the available space to in which to fabricate an independent MOSFET for each logic input. In other words, the minimum lithographic feature size and available surface determine the functionality limits of the programmable logic array.

Pass transistor logic is one of the oldest logic techniques and has been described and used in NMOS technology long before the advent of the CMOS technology currently employed in integrated circuits. A representative textbook by L. A. Glasser and D. W. Dobberpuhl, entitled "The design and analysis of VLSI circuits," Addison-Wesley, Reading Mass., 1985, pp. 16–20, describes the same. Pass transistor logic was later described for use in complementary pass transistor circuits in CMOS technology. Items which outline such use include a textbook by J. M. Rabaey, entitled "Digital Integrated Circuits; A design perspective," Prentice Hall, Upper Saddle River, N.J., pp. 210–222, 1996, and an article by K. Bernstein et al., entitled "High-speed design styles leverage IBM technology prowess," MicroNews, vol. 4, no. 3, 1998. What more, there have been a number of recent applications of complementary pass transistor logic in microprocessors. Articles which describe such applications include articles by T. Fuse et al., entitled "A 0.5V 200 mhz 1-stage 32b ALU using body bias controlled SOI pass-gate logic," Dig. IEEE Int. Solid-State Circuits Conf., San Francisco, pp. 286–287, 1997, an article by K. Yano et al., entitled "Top-down pass-transistor logic design," IEEE J. Solid-State Circuits, Vol. 31, no. 6, pp. 792–803, June 1996, and an article by K. H. Cheng et al., entitled "A 1.2V CMOS multiplier using low-power current-sensing complementary pass-transistor logic", Proc. Third Int. Conf. On Electronics, Circuits and Systems, Rodos, Greece, 13–16 October, vol. 2, pp. 1037–40, 1996.

In another approach, differential pass transistor logic has been developed to overcome concerns about low noise margins in pass transistor logic. This has been described in an article by S. I. Kayed et al., entitled "CMOS differential pass-transistor logic (CMOS DPTL) predischarge buffer design," 13th National Radio Science Conf., Cairo, Egypt, pp. 527–34, 1996, as well as in an article by V. G. Oklobdzija, entitled "Differential and pass-transistor CMOS logic for high performance systems," Microelectronic J., vol. 29, no. 10, pp. 679–688, 1998. Combinations of pass-transistor and CMOS logic have also been described. S. Yamashita et al., "Pass-transistor? CMOS collaborated logic: the best of both worlds," Dig. Symp. On VLSI Circuits, Kyoto, Japan, 12–14 June, pp. 31–32, 1997. Also, a number of comparisons of pass transistor logic and standard CMOS logic have been made for a variety of different applications and power supply voltages. These studies are described in an article by R. Zimmerman et al., entitled "Low-power logic styles: CMOS versus pass transistor logic," IEEE J. Solid-State Circuits, vol. 32, no. 7, pp. 1079–1790, July 1997, and in an article by C. Tretz et al., "Performance comparison of differential static CMOS circuit topologies in SOI technology," Proc. IEEE Int. SOI Conference, October 5–8, FL, pp. 123–4, 1998.

However, all of these studies and articles on pass transistor logic have not provided a solution to the constraints placed on programmable logic arrays by the limits of the minimum lithographic feature size and the deficit in the available chip surface space. An approach which touches upon overcoming the limits of the minimum lithographic feature size and the deficit in the available chip surface space, is disclosed in the following co-pending, commonly assigned U.S. patent applications by Len Forbes and Kie Y. Ahn, entitled: "Programmable Logic Arrays with Transistors with Vertical Gates," Ser. No. 09/583,584, "Horizontal Memory Devices with Vertical Gates," Ser. No. 09/584,566, and "Programmable Memory Decode Circuits with Vertical Gates," Ser. No. 09/584,564. Those disclosures are all directed toward a non volatile memory cell structure having vertical floating gates and vertical control gates above a horizontal enhancement mode channel region. In those disclosures one or more of the vertical floating gates is charged by the application of potentials to an adjacent vertical gate. The devices of those disclosures can be used as flash memory, EAPROM, EEPROM devices, programmable memory address and decode circuits, and/or programmable logic arrays. Those applications, however, are not framed to address overcoming the limits of the minimum lithographic feature size and the deficit in the available chip surface space for purposes of pass transistor logic in programmable logic arrays.

Therefore, there is a need in the art to provide improved pass transistor logic in programmable logic arrays which overcome the aforementioned barriers.

SUMMARY OF THE INVENTION

The above mentioned problems with pass transistor logic in programmable logic arrays and other problems are addressed by the present invention and will be understood by reading and studying the following specification. Systems and methods are provided for pass transistor logic in programmable logic arrays having transistors with multiple vertical gates. The multiple vertical gates serve as multiple logic inputs. The multiple vertical gates are edge defined such that only a single transistor is required for multiple logic inputs. Thus, a minimal surface area is required for each logic input.

In one embodiment of the present invention, a novel programmable logic array is provided. The novel programmable logic array includes a plurality of input lines for receiving an input signal, a plurality of output lines, and one or more arrays having a first logic plane and a second logic plane connected between the input lines and the output lines. The first logic plane and the second logic plane comprise a plurality of logic cells arranged in rows and columns for providing a sum-of-products term on the output lines responsive to the received input signal. According to the teachings of the present invention, each logic cell includes a source region and a drain region in a horizontal substrate. A depletion mode channel region separates the source and the drain regions. A number of vertical gates are located above different portions of the depletion mode channel region. At least one of the vertical gates is located above a first portion of the depletion mode channel region and is separated from the channel region by a first thickness insulator material. At least one of the vertical gates is located above a second portion of the channel region and is separated from the channel region by a second thickness insulator material. According to the present invention, there is no source nor drain region associated with each input and the gates have sub-lithographic horizontal dimensions by virtue of being edge defined vertical gates.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION OF THE INVENTION

Figure 1A:
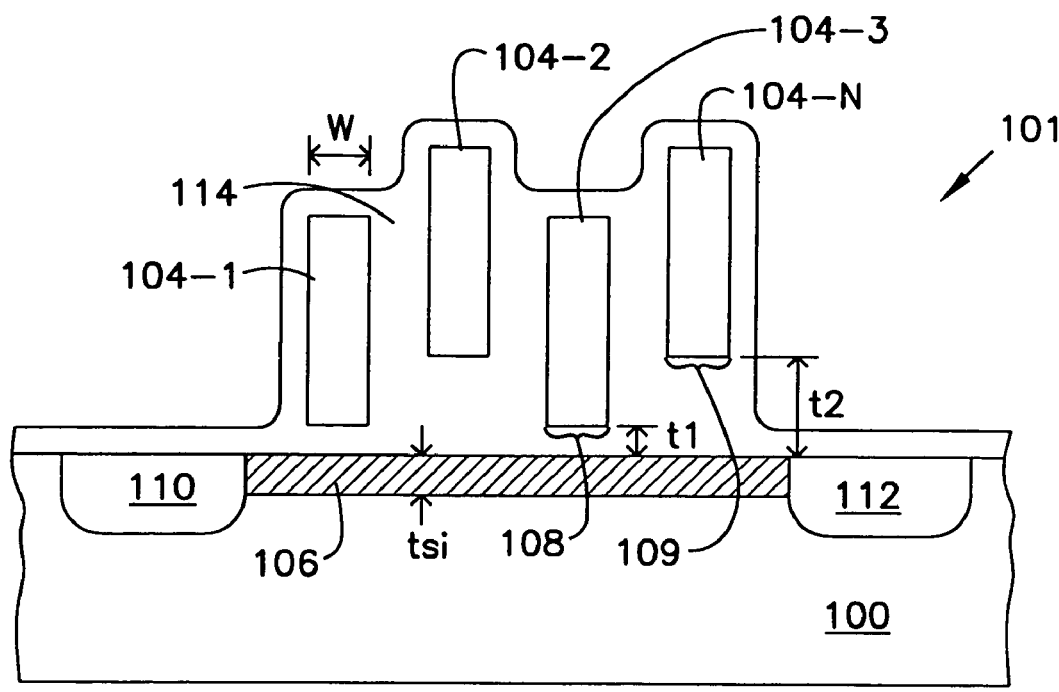
FIG. 1A illustrates a novel static pass transistor according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

According to the teachings of the present invention, a pass transistor logic is described where transistors with multiple vertical gates are employed in static CMOS combinational logic circuits. The pass transistors are similar to a regular series connection of individual transistors except here because of the close proximity of the gates of address lines separate and individual source/drain regions are not required between the gates. An implanted depletion mode channel serves to form the conductive region not only under each gate region but also between different gate regions.

FIG. 1A illustrates a novel static pass transistor 101 according to the teachings of the present invention. As shown in FIG. 1A, the static pass transistor 101 includes a source region 110 and a drain region 112 in a horizontal substrate 100. A depletion mode channel region 106 separates the source region 110 and the drain region 112. A number of vertical gates 104-1, 104-2, . . . , 104-N, are located above different portions of the depletion mode channel region 106. According to the teachings of the present invention, the number of vertical gates 104-1, 104-2, . . . , 104-N, are edge defined vertical gates such that each of the number of vertical gates 104-1, 104-2, . . . , 104-N, has a horizontal width (W) which is sub-lithographic in dimension. In one embodiment, each of the number of vertical gates 104-1, 104-2, . . . , 104-N, has a horizontal width of approximately 100 nanometers (nm). According to one embodiment of the present invention, the number of vertical gates 104-1, 104-2, . . . , 104-N, includes a number of polysilicon vertical gates 104-1, 104-2, . . . , 104-N. At least one of the vertical gates, e.g. vertical gate 104-3, is located above a first portion 108 of the depletion mode channel region 106 and is separated from the depletion mode channel region 106 by a first thickness insulator material (t1). In one embodiment, the first thickness insulator material (t1) includes a first oxide thickness (t1). At least one of the vertical gates, e.g. vertical gate 104-N, is located above a second portion 109 of the depletion mode channel region 106 and is separated from the depletion mode channel region 106 by a second thickness insulator material (t2). In one embodiment, the second thickness insulator material (t2) includes a second oxide thickness (t2). As shown in FIG. 1A, the second oxide thickness (t2) is greater than the first oxide thickness (t1). In one embodiment, the first oxide thickness (t1) is less than 50 Angstroms (Å) and the second oxide thickness (t2) is less than 350 Angstroms (Å). In one embodiment, the first oxide thickness (t1) is approximately 33 Å and the second oxide thickness (t2) is approximately 330 Å.

As shown in FIG. 1A, the number of vertical gates 104-1, 104-2, . . . , 104-N, are parallel and opposing one another. The number of vertical gates 104-1, 104-2, . . . , 104-N, are separated from one another by an intergate dielectric 114. In one embodiment, the intergate dielectric 114 includes silicon dioxide ($SiO_2$). In one embodiment, the number of vertical gates 104-1, 104-2, . . . , 104-N, have a vertical height of approximately 500 nanometers (nm). Also, in one embodiment of the present invention, the horizontal depletion mode channel has a depth (tsi) in the horizontal substrate of approximately 400 Å. According to the teachings of the present invention, the number of vertical gates 104-1, 104-2, . . . , 104-N, serve as logic inputs 104-1, 104-2, . . . , 104-N, for the static pass transistor 101.

Figure 1B:
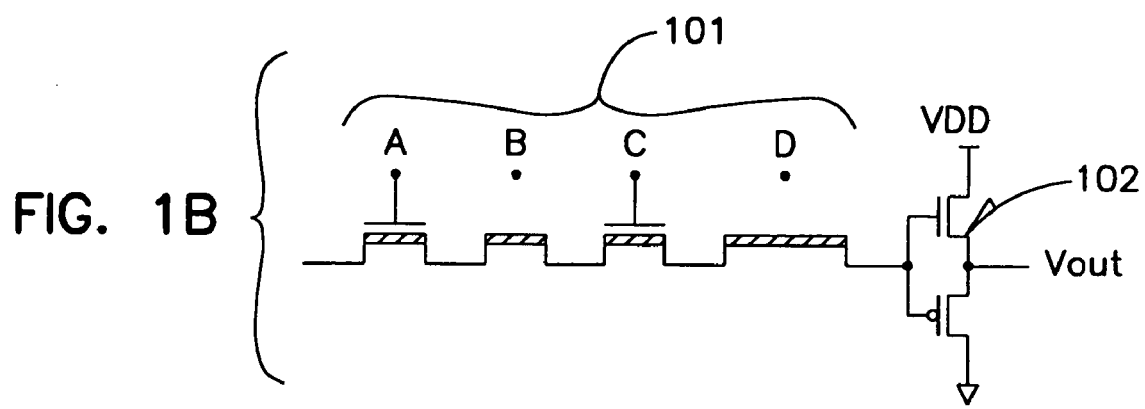
FIG. 1B is a schematic illustration of the novel static pass transistor shown in FIG. 1A.

FIG. 1B is a schematic illustration of the novel static pass transistor shown in FIG. 1A. The schematic of FIG. 1B shows the number of vertical gates 104-1, 104-2, . . . , 104-N, as multiple conductive nodes A, B, C, and D above the horizontal depletion mode channel. An independent potential can be applied to each of the conductive nodes A, B, C, and D. Conductive nodes A and C are represented as gates since they are separated from the depletion mode channel by the first oxide thickness. Conductive nodes B and D are shown just as nodes since they are separated from the depletion mode channel by the second oxide thickness. The static pass transistor 101 is further shown coupled to a buffer mode amplifier 102 to provide gain. The channel is uniformly depletion mode or normally "on" and can conduct with zero potential applied to the conductive nodes A, B, C, and D. In operation, the conductive nodes A and C serve as multiple logic inputs, or active inputs, and can effect conduction in the depletion mode channel. Conductive nodes B and D, on the other hand cannot effect conduction in the depletion mode channel because they are further distanced from the depletion mode channel by the second oxide thickness. In other words, conductive nodes B and D have no control over the depletion mode channel and can not turn the depletion mode channel "off." Conductive nodes B and D thus function as passing lines over the depletion mode channel. In one operation embodiment, if a negative potential is applied to either of the conductive nodes A and C this negative potential works to turn "off" a portion of the depletion mode channel beneath that particular conductive node or gate. In one operation embodiment, a negative potential of approximately −0.6 Volts applied to either conductive node A or C will block conduction in the depletion mode channel. On the other hand, if conductive nodes A and C both have an applied potential of approximately zero Volts then the novel static pass transistor 101 conducts. Thus, in this embodiment, the novel static pass transistor 101 operates as a two input positive logic NAND gate. The conductive nodes A, B, C, and D make up a logic chain. And, the novel static pass transistor can function with an operating voltage range of approximately +/−0.5 Volts.

Figure 1C:
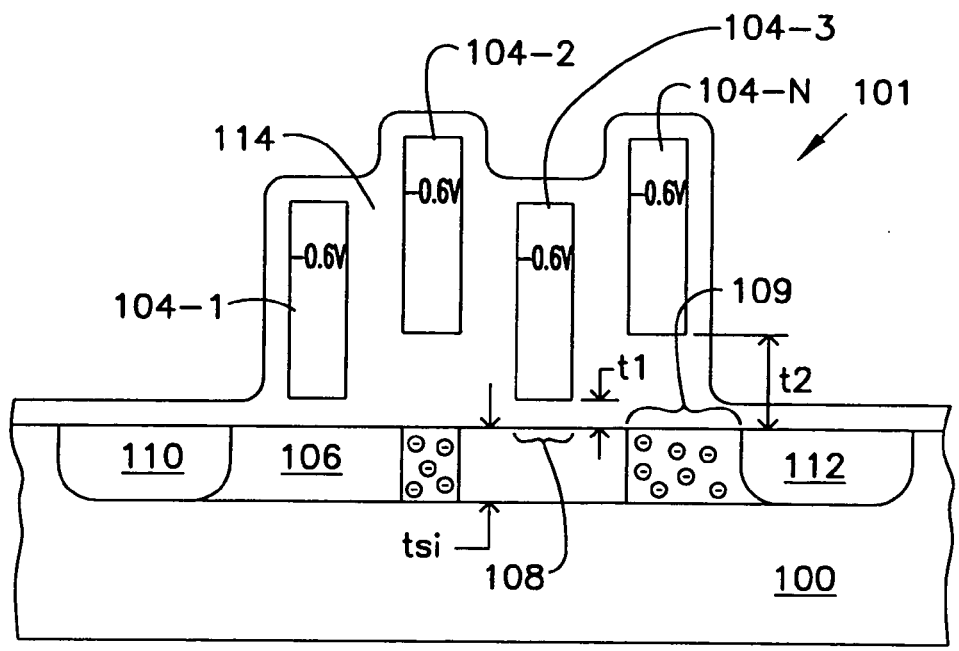
FIG. 1C is an illustration of the operation of the novel static pass transistor described in connection with FIGS. 1A and 1B.

FIG. 1C is an illustration of the operation of the novel static pass transistor described in connection with FIGS. 1A and 1B. FIG. 1C shows four vertical gates 104-1, 104-2, 104-3, and 104-4 formed of heavily doped n+ type polysilicon. The four vertical gates 104-1, 104-2, 104-3, and 104-4 are located above a horizontal depletion mode channel 106 which separates heavily doped n+ type source and drain regions, 110 and 112 respectively. The horizontal depletion mode channel includes a lightly doped n type channel. In FIG. 1C, a independent potential of −0.6 Volts is applied to each of the four vertical gates 104-1, 104-2, 104-3, and 104-4. Vertical gates 104-1 and 104-3 are separated by a first oxide thickness (t1) from the depletion mode channel which is less than a second oxide thickness (t2) separating vertical gates 104-2 and 104-4 from the depletion mode channel. Thus, the negative potential on vertical gates 104-1 and 104-3 turns off conduction in that portion of the depletion mode channel beneath those vertical gates as shown in FIG. 1C. By contrast, the negative potential on vertical gates 104-2 and 104-4 does not control or effect conduction in the depletion mode channel.

Figure 1D:
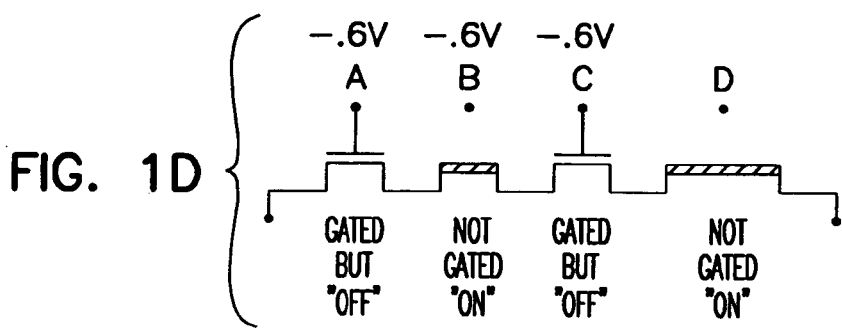
FIG. 1D is another characterization of the novel static pass transistor of FIG. 1C.
Figure 1E:
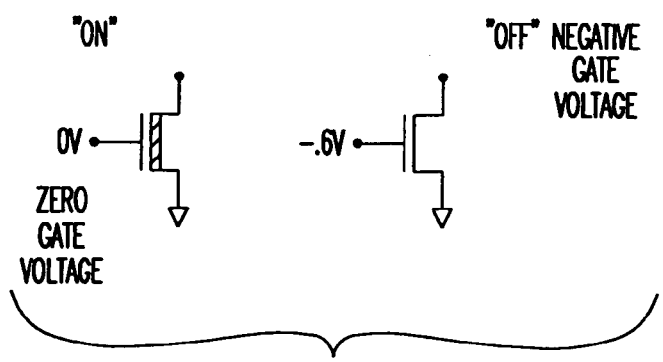
FIG. 1E is a further illustration showing that depletion mode n-channel MOSFETs are "on" with zero gate voltage and that a negative applied gate voltage turns "off" the depletion mode n-channel.

FIG. 1D is another characterization of the novel static pass transistor of FIG. 1C. Conductive nodes A, B, C, and D represent the four vertical gates 104-1, 104-2, 104-3, and 104-4. The regions beneath conductive nodes A and C with their negative applied potentials can be characterized as "gated," but "off." The regions beneath conductive nodes B and D with their negative applied potentials can be characterized as "not gated," or "on" since these conductive nodes are separated from the depletion mode channel by the thicker second oxide thickness. Conductive node B and D thus function as passing lines. FIG. 1E is a further illustration showing that depletion mode n-channel MOSFETs are "on" with zero gate voltage and that a negative applied gate voltage turns "off" the depletion mode n-channel. In one embodiment, the threshold voltage (Vt) required to turn "off" the depletion mode n-channel is approximately −0.6 Volts.

Figure 2A:
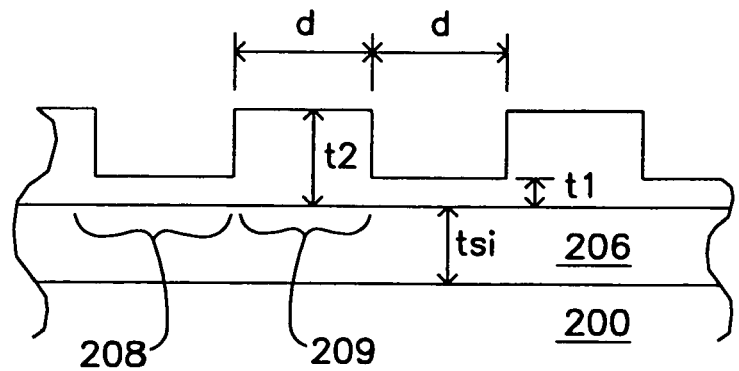
FIG. 2A illustrates one embodiment for the variance between the first oxide thickness (t1) and the second oxide thickness (t2) in the novel static pass transistor of the present invention.
Figure 2B:
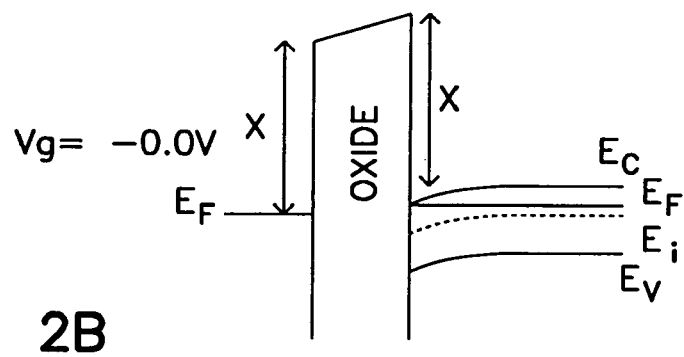
FIG. 2B is an energy band diagram illustrating the effect on the conduction in the depletion mode channel beneath the first oxide thickness (t1) when a zero Volts gate potential (Vg) is applied above according to one embodiment of the present invention.
Figure 2C:
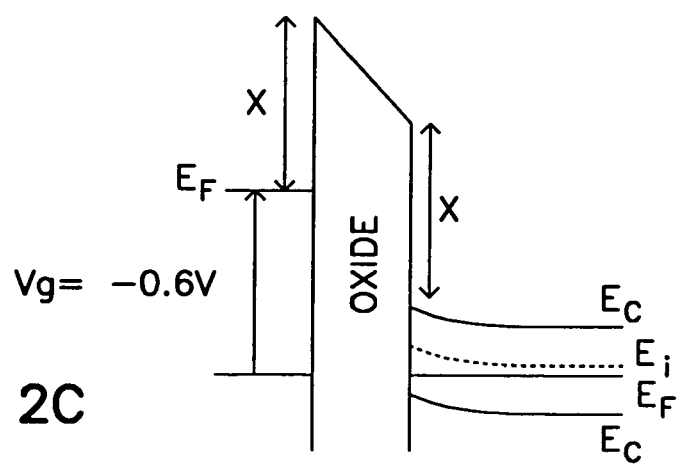
FIG. 2C is an energy band diagram illustrating the effect on the conduction in the depletion mode channel beneath the first oxide thickness (t1) with a negative applied gate potential (Vg) of approximately −0.6 Volts.

FIGS. 2A–2C illustrate an operating voltage range for the novel static pass transistor of the present invention for certain values of a first oxide thickness (t1) and a second oxide thickness (t2). FIG. 2A illustrates one embodiment for the variance between the first oxide thickness (t1) and the second oxide thickness (t2). As shown in FIG. 2A, the first oxide thickness (t1) and the second oxide thickness (t2) are located above a horizontal depletion mode channel 206. In the embodiment shown in FIG. 2A, first oxide thickness (t1) is less than the second oxide thickness (t2). In one embodiment, the first oxide thickness (t1) is approximately 33 Å and the second oxide thickness is approximately 330 Å. As shown in FIG. 2A, the depletion mode channel extends a thickness (tsi) into the horizontal substrate. In one embodiment, the thickness (tsi) is between 100 to 1000 Å. In one embodiment, the thickness (tsi) is approximately 400 Å. For purposes of illustration, the doping concentration (Nd) in this embodiment is approximately $6.25 \times 10^{17}$ atoms/cm$^3$. The capacitance of the oxide (Cox) can be calculated as by dividing the electric permittivity of oxide (approximately $0.353 \times 10^{-12}$ Farads/cm) by the thickness of the oxide. An oxide capacitance (Cox) for the thin or first oxide thickness (t1) of 33 Å is approximately $(0.353 \times 10^{-12}$ Farads/cm$)/(33 \times 10^{-8}$ cm) or approximately $10^{-6}$ Farads/cm$^2$. The charge Qb in the horizontal depletion mode channel is (q)×(Nd)×(tsi), or approximately $0.4 \times 10^{-6}$ Coulombs/cm$^2$. The bulk charge over the oxide capacitance for the thin or first thickness oxide (t1) can be stated as V=Qb/Cox or approximately 0.4 Volts. On the other hand the bulk charge over the oxide capacitance for the thicker or second oxide thickness (t2) of approximately 330 Å will be significantly greater.

FIG. 2B is an energy band diagram illustrating the effect on the conduction in the depletion mode channel beneath the first oxide thickness (t1) when a zero Volts gate potential (Vg) is applied above. As shown in FIG. 2B, when zero (0.0) Volts are applied to a gate (Vg) above the first oxide thickness (t1) the Fermi level (Ef) in the silicon channel will be approximately 0.4 Volts, above the intrinsic level (Ei). In other words, since the horizontal depletion mode channel is doped the Fermi level (Ef) in the channel is above that for intrinsic silicon (Ei), e.g. 0.35 Volts, and closer to the conduction band (Ec). From the illustrative calculations provided above in connection with FIG. 2A the Fermi level (Ef) in the channel is approximately 0.4 Volts. Thus, for a zero Volts gate potential (Vg) the Fermi levels (Ef) in the polysilicon gate and the channel are approximately aligned and conduction will occur in the horizontal depletion mode channel.

FIG. 2C is an energy band diagram illustrating the effect on the conduction in the depletion mode channel beneath the first oxide thickness (t1) when a negative gate potential (Vg) of approximately −0.6 Volts is applied above. As shown in FIG. 2C, an applied gate potential (Vg) of a negative −0.6 Volts will raise the Fermi level in a polysilicon vertical gate and suppress the Fermi level in the doped channel beneath the first oxide thickness (t1) to even with or below the Fermi level value for intrinsic silicon such that the Fermi level in the channel is then closer to the valence band (Ev) in the channel. In this state no conduction will occur in this portion of the channel and the channel is turned "off." Thus, an applied potential of approximately a negative −0.6 Volts, accounting for a work function difference of approximately a negative −0.2 Volts and other variables involved such as an oxide charge if any, will be sufficient to overcome the bulk charge over the oxide capacitance (e.g. 0.4 V) across the thin or first thickness oxide (t1) of approximately 33 Å. The negative −0.6 Volts gate potential can thus turn "off" the normally "on" depletion mode channel. In other words, according to the teachings of the present invention, the novel static pass transistor can operate with an operating voltage range of approximately half a Volt (0.6 V)

Figure 3A:
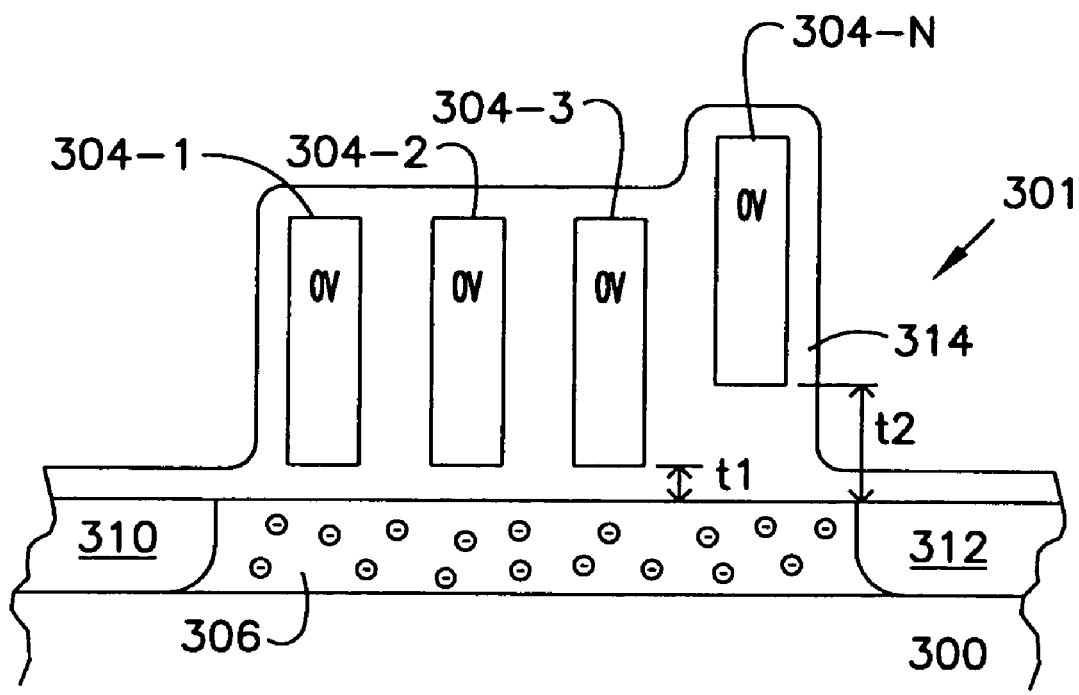
FIG. 3A is an illustration of another embodiment configuration for the novel static pass transistor of the present invention.

FIG. 3A is an illustration of another embodiment configuration for the novel static pass transistor of the present invention. In other words, FIG. 3A shows a different "input" configuration and the conductivity or resistance of the depletion mode channel with different input voltages. FIG. 3A shows four vertical gates 304-1, 304-2, 304-3, and 304-4 formed of heavily doped n+ type polysilicon. The four vertical gates 304-1, 304-2, 304-3, and 304-4 are located above a horizontal depletion mode channel 306 which separates heavily doped n+ type source and drain regions, 310 and 312 respectively. The horizontal depletion mode channel includes a lightly doped n type channel. In the operational embodiment of FIG. 3A, an independent potential of zero Volts is applied to vertical gates 304-1, 304-2, and 304-3. An independent potential of −0.6 Volts is applied to vertical gate 304-4. Vertical gates 304-1, 304-2, and 304-3 are separated by a first oxide thickness (t1) from the depletion mode channel 306 which is less than a second oxide thickness (t2) separating vertical gate 304-4 from the depletion mode channel. As explained and described in detail above, potential applied to vertical gate 304-4 does not control the conduction in the horizontal depletion mode channel due to its separation therefrom by the thicker second oxide thickness. Thus, the negative potential on vertical gates 304-4 does not turn off conduction in that portion of the depletion mode channel beneath it. Further, since an independent potential of zero Volts is applied to vertical gates 304-1, 304-2, and 304-3, there is no reduction in the conduction of the depletion mode channel beneath these vertical gates or active inputs either. However, since vertical gates 304-1, 304-2, and 304-3 are active inputs a negative potential applied independently to any one of these gates would turn "off" conduction in that portion of the depletion mode channel beneath it. In other words, these active inputs 304-1, 304-2, and 304-3 can control or effect conduction in the depletion mode channel.

Figure 3B:
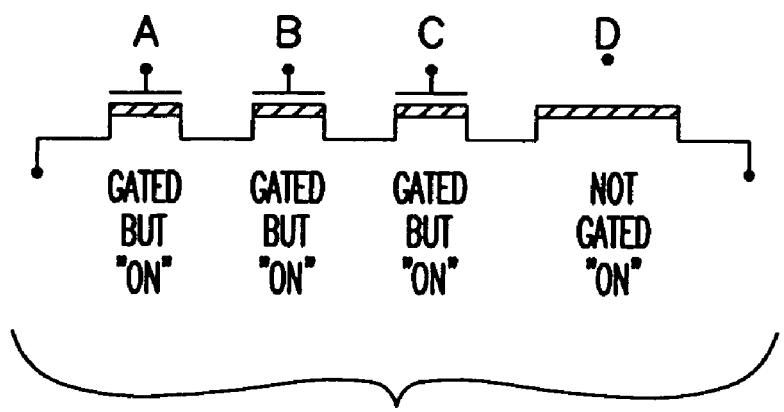
FIG. 3B is another characterization of the novel static pass transistor of FIG. 3A.

FIG. 3B is another characterization of the novel static pass transistor of FIG. 3A. Conductive nodes A, B, C, and D represent the four vertical gates 304-1, 304-2, 304-3, and 304-4. The regions beneath conductive nodes A, B and C with their zero applied potential can be characterized as "gated," but "on." The regions beneath conductive node D with its negative applied potentials can be characterized as "not gated," or "on" since this conductive node is separated from the depletion mode channel by the thicker second oxide thickness. Conductive node D thus functions as a passing line in this embodiment.

Figure 4A:
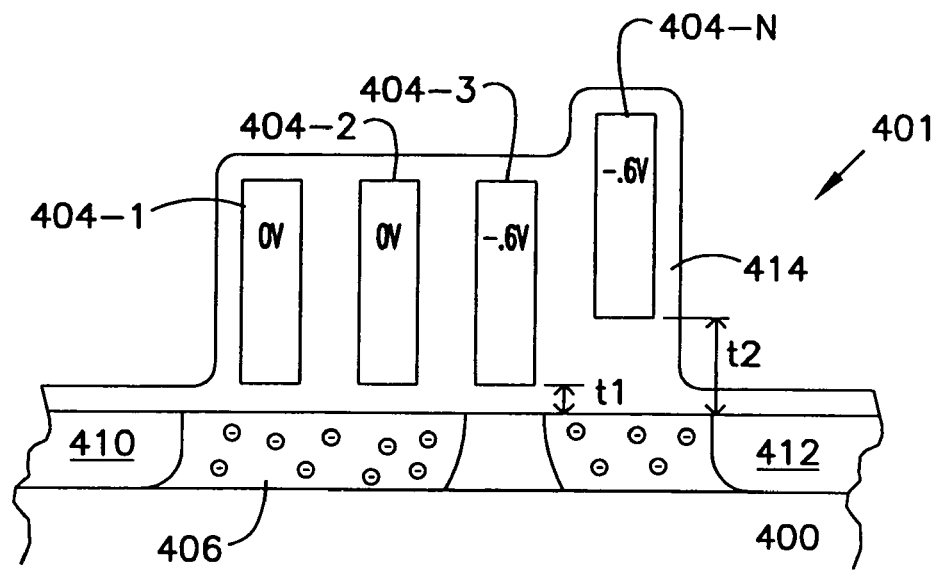
FIG. 4A is an illustration of another operational state for the novel static pass transistor shown in FIGS. 3A and 3B.

FIG. 4A is an illustration of another operational state for the novel static pass transistor shown in FIGS. 3A and 3B.

In effect, FIG. 4A shows operation of the novel static pass transistor shown in FIGS. 3A and 3B with different input voltages. FIG. 4A shows four vertical gates 404-1, 404-2, 404-3, and 404-4 formed of heavily doped n+ type polysilicon. The four vertical gates 404-1, 404-2, 404-3, and 404-4 are located above a horizontal depletion mode channel 406 which separates heavily doped n+ type source and drain regions, 410 and 412 respectively. The horizontal depletion mode channel includes a lightly doped n type channel. In the operational embodiment of FIG. 4A, a independent potential of zero Volts is applied to vertical gates 404-1 and 404-2. An independent potential of −0.6 Volts is applied to vertical gates 404-3 and 404-4. Vertical gates 404-1, 404-2, and 404-3 are separated by a first oxide thickness (t1) from the depletion mode channel 406 which is less than a second oxide thickness (t2) separating vertical gate 404-4 from the depletion mode channel. As explained and described in detail above, potential applied to vertical gate 404-4 does not control the conduction in the horizontal depletion mode channel due to its separation therefrom by the thicker second oxide thickness. Thus, the negative potential on vertical gate 404-4 does not turn off conduction in that portion of the depletion mode channel beneath it. Further, since an independent potential of zero Volts is applied to vertical gates 404-1 and 404-2 there is no reduction in the conduction of the depletion mode channel beneath these vertical gates, or active inputs either. However, since vertical gate 404-3 is an active input, the negative potential of −0.6 Volts applied independently to this gate does turn "off" conduction in that portion of the depletion mode channel beneath it.

Figure 4B:
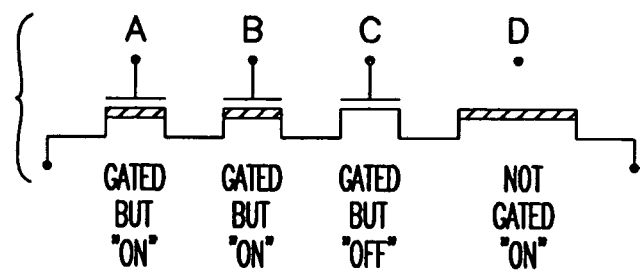
FIG. 4B is another characterization of the novel static pass transistor of FIG. 4A.

FIG. 4B is another characterization of the novel static pass transistor of FIG. 4A. Conductive nodes A, B, C, and D represent the four vertical gates 404-1, 404-2, 404-3, and 404-4. The regions beneath conductive nodes A and B with their zero applied potential can be characterized as "gated," but "on." The region beneath conductive node C with its negative applied potential can be characterized as "gated," and "off." The regions beneath conductive node D with its negative applied potentials can be characterized as "not gated," or "on" since this conductive node is separated from the depletion mode channel by the thicker second oxide thickness. Conductive node D thus functions as a passing line in this embodiment.

Figure 5:
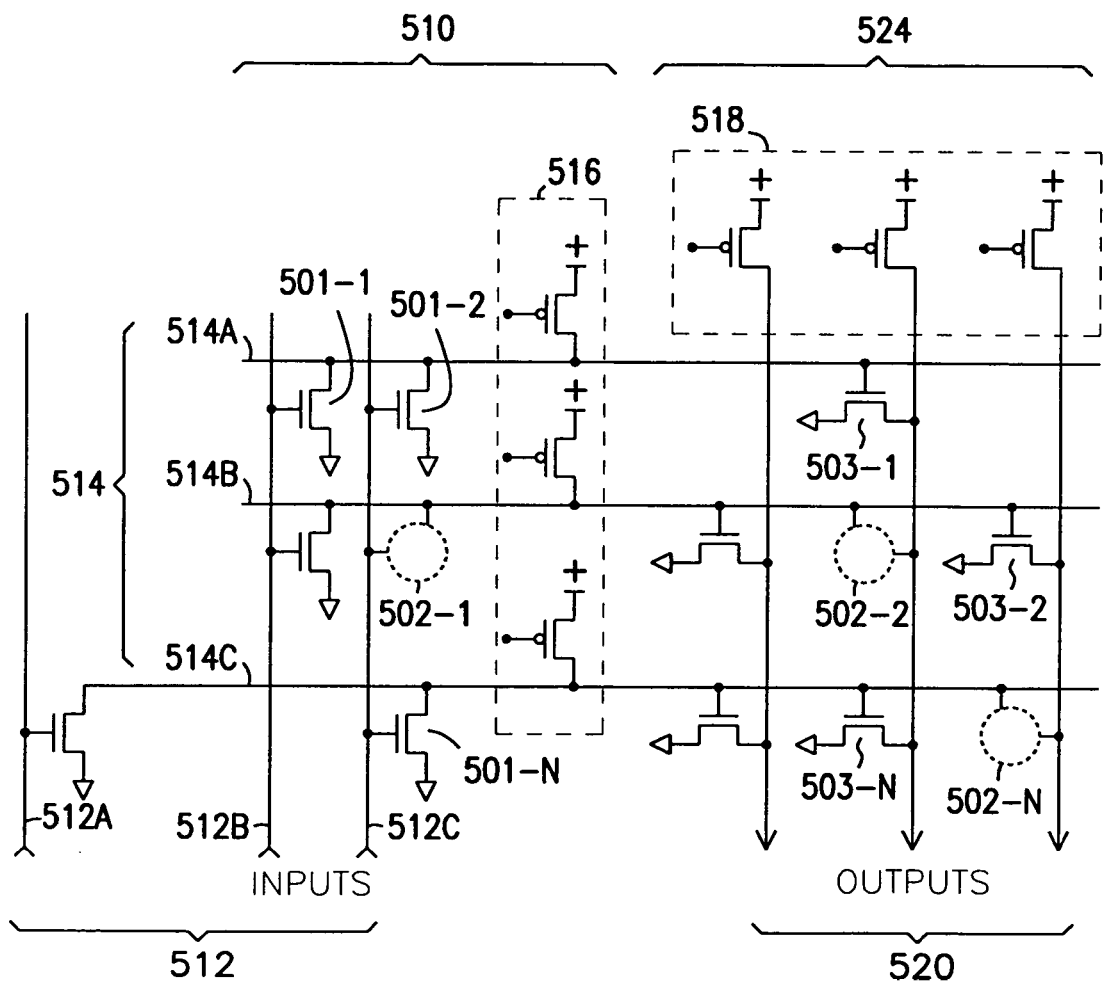
FIG. 5 illustrates a programmable logic array according to the teachings of the prior art.

FIG. 5 shows a conventional NOR-NOR logic array 500 which is programmable at the gate mask level by either fabricating a thin oxide gate transistor, e.g. logic cells 501-1, 501-2, . . . , 501-N and 503-1, 503-2, . . . , 503-N, at the intersection of lines in the array or not fabricating a thin oxide gate transistor, e.g. missing thin oxide transistors, 502-1, 502-2, . . . , 502-N, at such an intersection. As one of ordinary skill in the art will understand upon reading this disclosure, the same technique is conventionally used to form other types of logic arrays not shown. As shown in FIG. 5, a number of PMOS transistors, 516 and 518 respectively, are used as load devices.

The conventional logic array shown in FIG. 5 includes a first logic plane 510 which receives a number of input signals at input lines 512. In this example, no inverters are provided for generating complements of the input signals. However, first logic plane 510 can include inverters to produce the complementary signals when needed in a specific application.

First logic plane 510 includes a number of thin oxide gate transistors, e.g. transistors 501-1, 501-2, . . . , 501-N. The thin oxide gate transistors, 501-1, 501-2, . . . , 501-N, are located at the intersection of input lines 512, and interconnect lines 514. In the conventional PLA of FIG. 5, this selective fabrication of thin oxide gate transistor, e.g. transistors 501-1, 501-2, . . . , 501-N, is referred to as programming since the logical function implemented by the programmable logic array is entered into the array by the selective arrangement of the thin oxide gate transistors, or logic cells, 501-1, 501-2, . . . , 501-N, at the intersections of input lines 512, and interconnect lines 514 in the array.

In this embodiment, each of the interconnect lines 514 acts as a NOR gate for the input lines 512 that are connected to the interconnect lines 514 through the thin oxide gate transistors, 501-1, 501-2, . . . , 501-N, of the array. For example, interconnection line 514A acts as a NOR gate for the signals on input lines 512B and 512C. That is, interconnect line 514A is maintained at a high potential unless one or more of the thin oxide gate transistors, 501-1, 501-2, . . . , 501-N, that are coupled to interconnect line 514A are turned on by a high logic level signal on one of the input lines 512. When a control gate address is activated, through input lines 512, each thin oxide gate transistor, e.g. transistors 501-1, 501-2, . . . , 501-N, conducts which performs the NOR positive logic circuit function, an inversion of the OR circuit function results from inversion of data onto the interconnect lines 514 through the thin oxide gate transistors, 501-1, 501-2, . . . , 501-N, of the array.

As shown in FIG. 5, a second logic plane 524 is provided which includes a number of thin oxide gate transistors, e.g. transistors 503-1, 503-2, . . . , 503-N. The thin oxide gate transistors, 503-1, 503-2, . . . , 503-N, are located at the intersection of interconnect lines 514, and output lines 520. Here again, the logical function of the second logic plane 524 is implemented by the selective arrangement of the thin oxide gate transistors, 503-1, 503-2, . . . , 503-N, at the intersections of interconnect lines 514, and output lines 520 in the second logic plane 524. The second logic plane 524 is also configured such that the output lines 520 comprise a logical NOR function of the signals from the interconnection lines 514 that are coupled to particular output lines 520 through the thin oxide gate transistors, 503-1, 503-2, . . . , 503-N, of the second logic plane 524. Thus, in FIG. 5, the incoming signals on each line are used to drive the gates of transistors in the NOR logic array as the same is known by one of ordinary skill in the art and will be understood by reading this disclosure.

Figure 6:
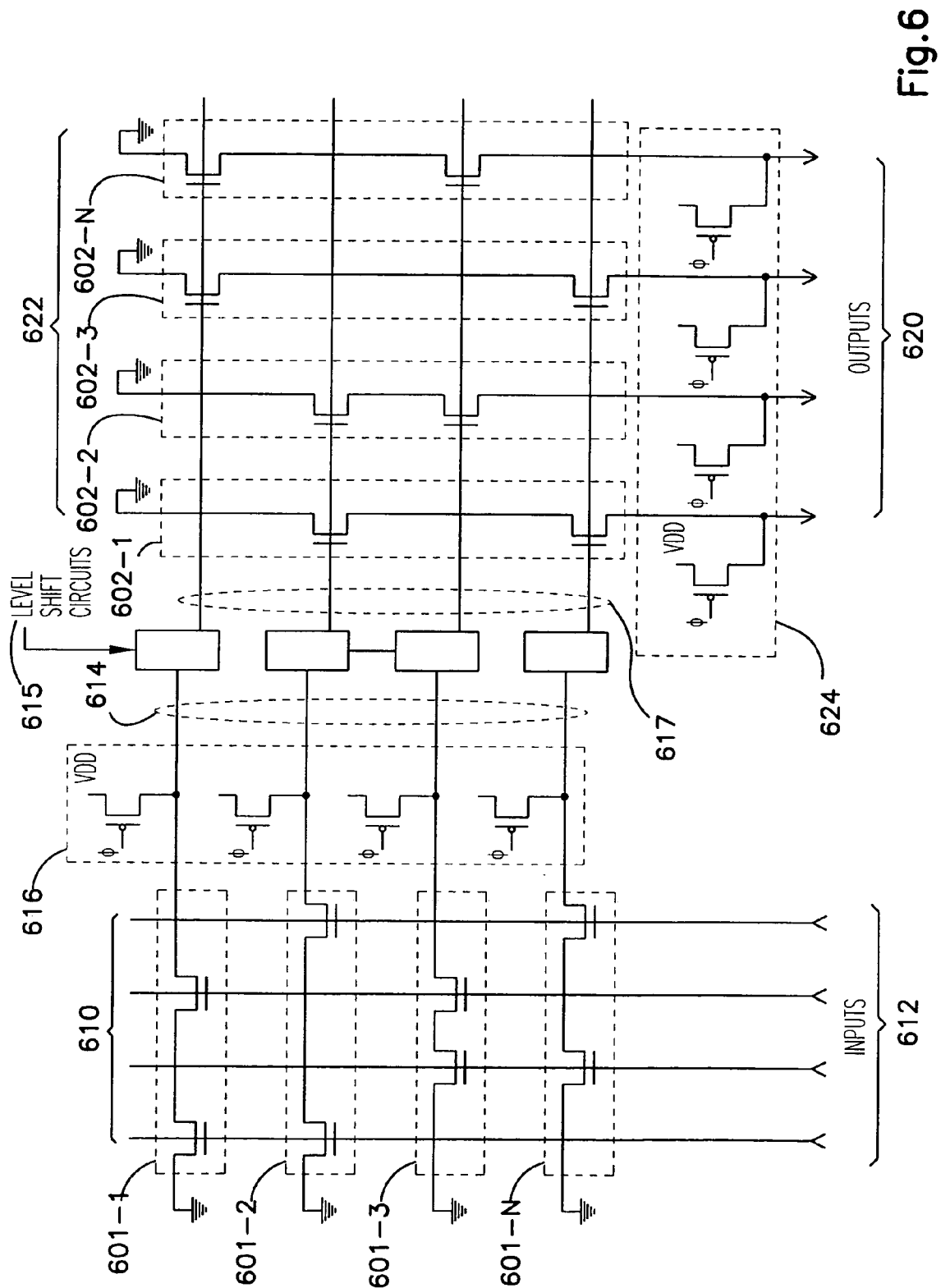
FIG. 6 illustrates an embodiment for a novel programmable logic array according to the teachings of the present invention.

FIG. 6 illustrates an embodiment of a novel programmable logic array (PLA) 600 formed according to the teachings of the present invention. In FIG. 6, PLA 600 implements an illustrative logical function using a two level logic approach. Specifically, PLA 600 includes first and second logic planes 610 and 622. In this example, the logic function is implemented using NAND—NAND logic. According to the teachings of the present invention, pass transistors with multiple vertical gates are best utilized in realizing NAND circuit functions rather than NOR gates.

As shown in FIG. 6, the PLA 600 is programmable at the gate mask level by fabricating a plurality or number of logic cells, e.g. logic cells 601-1, 601-2, . . . , 601-N in first logic plane 610 and logic cells 602-1, 602-2, . . . , 602-N in second logic plane 622, at the intersection of lines in the PLA 600. The number of logic cells, e.g. logic cells 601-1, 601-2, . . . , 601-N in first logic plane 610 and logic cells 602-1, 602-2, . . . , 602-N in second logic plane 622, thus serve as driver cells. FIG. 6 shows a number of PMOS transistors, 616 and 624 respectively, are used as load devices.

The number of logic cells, e.g. logic cells 601-1, 601-2, . . . , 601-N in first logic plane 610 and logic cells 602-1, 602-2, . . . , 602-N in second logic plane 622, are formed according to the teachings of the present invention such that each logic cell includes a number of edge defined vertical gates located above a horizontal depletion mode channel separating a single source and a single drain region. The first logic plane 610 receives a number of input signals at first input lines 612. As shown in FIG. 6, input lines 612 couple to the number of vertical gates in each of the number of logic cells 601-1, 601-2, . . . , 601-N in first logic plane 610. As one of ordinary skill in the art will understand upon reading this disclosure, some of the vertical gates serve as active inputs, which control conduction in the horizontal depletion mode channel, for a given logic cell and others of the vertical gates serve as passing lines for a given logic cell. The same has been discussed and described in detail in connection with FIGS. 1A–4B.

According to the teachings of the present invention, each logic cell is fabricated to include a different arrangement of active inputs, or logic inputs, coupled to the first input lines 612. As shown in FIG. 6, a number of p-channel metal oxide semiconductor (PMOS) load transistors 616 are used as load devices and are coupled to the first output lines, or row lines, 614, of the PLA 600. In the embodiment shown in FIG. 6, first output lines 614 are coupled through a number of level shift circuits 615 to a number of second input lines 617 which provide input signals to the second logic plane 622. Thus, the input signals on first input lines 612 are used to operate the number of vertical gates in the number of logic cells 601-1, 601-2, . . . , 601-N in first logic plane 610. Again, the number of logic cells 601-1, 601-2, . . . , 601-N in first logic plane 610 have horizontal depletion mode n-type channels beneath the number of edge defined vertical gates. Each logic cell 601-1, 601-2, . . . , 601-N in first logic plane 610 thus includes multiple gate inputs, logic gates, or logic inputs. The horizontal depletion mode channels separate a single source and a single drain region for each logic cell 601-1, 601-2, . . . , 601-N in first logic plane 610. Thus, less than one transistor is required for the multiple logic inputs of the present invention. This results in minimal area being associated with each logic input and a minimal area being taken up by the PLA 600 according to the teachings of the present invention.

In FIG. 6, each of the number of logic cells 601-1, 601-2, . . . , 601-N in first logic plane 610 acts as a NAND gate for connecting the input signals received on first input lines 612 to the first output lines 614. In the embodiment shown in FIG. 6, each of the number of logic cells 601-1, 601-2, . . . , 601-N in first logic plane 610 includes four vertical gates located above the horizontal depletion mode channel for the cell. In each of the logic cells, 601-1, 601-2, 601-3, . . . , 601-N, for example, in first logic plane 610, two of the vertical gates serve as active inputs, e.g. are separated by a first oxide thickness from the horizontal depletion mode channel. In each of the previous logic cells, two of the vertical gates serve as passing lines, e.g. are separated by a greater, second oxide thickness from the horizontal depletion mode channel. Such a variation in the order and arrangement of the vertical gates for the logic cells 601-1, 601-2, . . . , 601-N in first logic plane 610 is discussed and described in detail in connection with FIG. 1A–4B. All of the vertical gates in logic cells 601-1, 601-2, . . . , 601-N in first logic plane 610 are coupled to the first input lines 612. As one of ordinary skill in the art will understand upon reading this disclosure, any number of logic cells 601-1, 601-2, . . . , 601-N can be included in first logic plane 610, the invention is not so limited. Further, any number of vertical gates can be included in each logic cell 601-1, 601-2, . . . , 601-N depending on the number of logic inputs, e.g. active inputs and passing lines desired for the first logic plane 610 in the PLA 600. The invention is not so limited.

In a similar manner, second logic plane 622 comprises a number of logic cells, e.g. logic cells 602-1, 602-2, . . . , 602-N which are formed according to the teachings of the present invention such that each logic cell includes a number of edge defined vertical gates located above a horizontal depletion mode channel separating a single source and a single drain region. The second logic plane 622 receives a number of input signals on second input lines 617, e.g. output signals from the first logic plane 610. As shown in FIG. 6, second input lines 617 couple to the number of vertical gates in each of the number of logic cells 602-1, 602-2, . . . , 602-N in second logic plane 622. As one of ordinary skill in the art will understand upon reading this disclosure, some of the vertical gates serve as active inputs, which control conduction in the horizontal depletion mode channel, for a given logic cell and others of the vertical gates serve as passing lines for a given logic cell. The same has been discussed and described in detail in connection with FIGS. 1A–4B.

According to the teachings of the present invention, each logic cell is fabricated to include a different arrangement of active inputs, or logic inputs, coupled to the second input lines 617. The number of second input lines 617 provide input signals, e.g. output signals from the first logic plane 610, to the second logic plane 622. In the embodiment shown in FIG. 6, second input lines 617 are coupled to the number of second output lines 620 through the number of logic cells 602-1, 602-2, . . . , 602-N in second logic plane 622. Thus, the input signals on second input lines 617, e.g. output signals from the first logic plane 610, are used to operate the number of vertical gates in the number of logic cells 602-1, 602-2, . . . , 602-N in the second logic plane 622. Again, the number of logic cells 602-1, 602-2, . . . , 602-N in second logic plane 622 have horizontal depletion mode n-type channels beneath a number of edge defined vertical gates. Each logic cell 602-1, 602-2, . . . , 602-N in second logic plane 622 thus includes multiple gate inputs, logic gates, or logic inputs. The horizontal depletion mode channels separate a single source and a single drain region for each logic cell 602-1, 602-2, . . . , 602-N in second logic plane 622. For each logic cell 602-1, 602-2, . . . , 602-N in second logic plane 622 the single source is coupled to ground and the single drain is coupled to a number of p-channel metal oxide semiconductor (PMOS) load transistors 624, which are used as load devices, and are coupled to a number of second output lines, or row lines, 620, of the PLA 600. Thus, less than one transistor is required for the multiple logic inputs of the present invention. This results in minimal area being associated with each logic input and a minimal area being taken up by the PLA 600 according to the teachings of the present invention.

In FIG. 6, each of the number of logic cells 602-1, 602-2, . . . , 602-N in second logic plane 622 acts as a NAND gate for coupling the input signals received on the second input lines 617, e.g. output signals from the first logic plane 610, to the second output lines 620. In the embodiment shown in FIG. 6, each of the number of logic cells 602-1, 602-2, . . . , 602-N in second logic plane 622 includes four vertical gates located above the horizontal depletion mode channel for the cell. In each logic cell 602-1, 602-2, . . . , 602-N in second logic plane 622, two of the vertical gates serve as active inputs, e.g. are separated by a first oxide thickness from the horizontal depletion mode channel. In each logic cell, two of the vertical gates serve as passing lines, e.g. are separated by a greater, second oxide thickness from the horizontal depletion mode channel. Such a variation in the order and arrangement of the vertical gates for the logic cells 602-1, 602-2, . . . , 602-N in second logic plane 622 is discussed and described in detail in connection with FIG. 1A-4B. All of the vertical gates in logic cells 602-1, 602-2, . . . , 602-N in second logic plane 610 are coupled to the second input lines 617. As one of ordinary skill in the art will understand upon reading this disclosure, any number of logic cells 602-1, 602-2, . . . , 602-N can be included in second logic plane 622, the invention is not so limited. Further, any number of vertical gates can be included in each logic cell 602-1, 602-2, . . . , 602-N depending on the number of logic inputs, e.g. active inputs and passing lines, desired for the second logic plane 622 in the PLA 600. The invention is not so limited.

In one operational embodiment of first logic plane 610, row lines 614, or first output lines 614 as shown in FIG. 6, are maintained high through each clock cycle. That is while logic cells 601-1, 601-2, . . . , 601-N in first logic plane 610 are in an off state, an open is provided to the drain of the load device transistors 616. The VDD voltage level is applied to corresponding first output lines 614 and high signal level applied to the second input lines 617 for the second logic plane 622 through level shift circuits 615 when a load device transistor 616 is turned on by a clock signal received at the gate of the load device transistors 616 (Φ). When a particular logic cell 601-1, 601-2, . . . , 601-N coupled to a row line 614 conducts, e.g. all of the active inputs for the logic cell 601-1, 601-2, . . . , 601-N coupled to that row line are signaled high, the row line is pulled low. That is, in one embodiment according to the teachings of the present invention as described and explained in detail above, the number of logic cells 601-1, 601-2, . . . , 601-N in first logic plane 610 conduct through the depletion mode channel when all active inputs for that logic cell transition from a negative 0.6 Volts to 0.0 Volts. In other words, to pull a row line low requires that each of the active inputs, e.g. vertical gates over first oxide thickness, be signaled high (in one embodiment 0.0 Volts) from first input lines 612. The horizontal depletion mode channel in each logic cell will be "on" and conduct when all of the active gate inputs are high. Conversely, if any of the active gate inputs for a given logic cell are signaled low or in one embodiment –0.6 Volts those active inputs will act to turn "off" the conduction in the horizontal depletion mode channel. The operation of the second logic plane 622 behaves in an analogous manner.

It is noted that the configuration of FIG. 6 is provided by way of example and not by way of limitation. Specifically, the teachings of the present application are not limited to programmable logic arrays in the NAND—NAND approach. Further, the teachings of the present application are not limited to the specific logical function shown in FIG. 6. Other logical functions can be implemented in a programmable logic array, with the novel logic cells of the present invention, 601-1, 601-2, . . . , 601-N and 602-1, 602-2, . . . , 602-N respectively in conjunction with appropriate load transistors, using any one of the various two level logic approaches. In this example, no inverters are provided for generating complements of the input signals. However, as one of ordinary skill in the art will understand upon reading this disclosure, inverters can by used to produce the complementary signals when needed in a specific application. Thus, the above described selective interconnection of the novel logic cells, 601-1, 601-2, . . . , 601-N and 602-1, 602-2, . . . , 602-N respectively, is referred to as programming since the logical function implemented by the programmable logic array is entered into the array by the novel logic cells, 601-1, 601-2, . . . , 601-N and 602-1, 602-2, . . . , 602-N respectively, that are used at the intersections of the first input lines 612, the first output lines 614 and the second input lines 617, and the second output lines 620 in the PLA 600. Accordingly, any desired logic function can be implemented in the form of a PLA 600 having the novel logic cells of the present invention. Programmability of the novel logic cells is accomplished as described above by the selective arrangement active inputs and passive inputs for the multiple vertical gate transistors of the present invention.

Figure 7A:
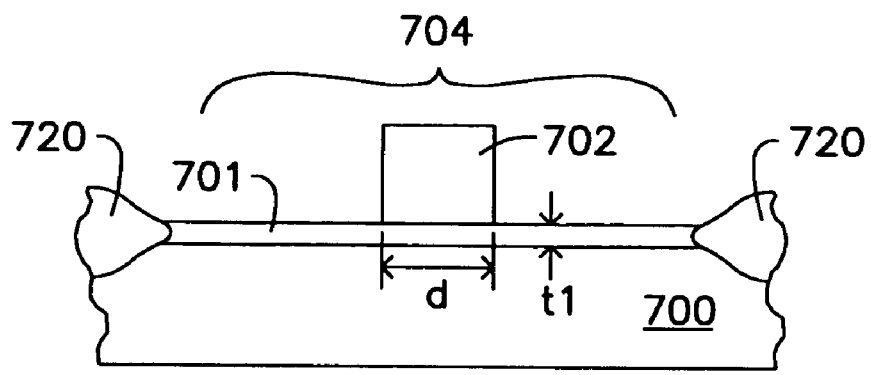
FIGS. 7A–7F illustrate one method for forming the novel static pass transistors of the present invention.

FIGS. 7A–7F illustrate one method for forming the novel static pass transistors of the present invention. FIG. 7A illustrates the structure after the first sequence of processing steps. In FIG. 7A, a thin gate oxide 701 is formed over an active device area 704, between a pair of field isolation oxides (FOXs) 720, in a horizontal surface of a substrate 700. The thin gate oxide 701 is formed to a first oxide thickness (t1). In one embodiment, the thin gate oxide 701 is formed to a thickness (t1) of less than 50 Angstroms (Å). In one embodiment, the thin gate oxide 701 is formed to a thickness (t1) of approximately 33 Angstroms (Å). One of ordinary skill in the art will understand upon reading this disclosure the various suitable manners in which a thin gate oxide 701 can be formed over the active device area 704. For example, in one embodiment, the thin gate oxide can be formed by thermal oxidation, and the FOXs can be formed using local oxidation of silicon (LOCOS) as the same are known and understood by one of ordinary skill in the art. After growth of the thin gate oxide 701 by thermal oxidation, and the LOCOS isolation 720, a thick layer of sacrificial oxide 702 is deposited over the surface of the thin gate oxide 701. In one embodiment, the thick layer of sacrificial oxide 702 is deposited to a thickness of approximately 0.5 micrometers (μm) using a low-pressure chemical vapor deposition (LPCVD) technique. Using a photoresist mask, according to photolithography techniques which are known and understood by one of ordinary skill in the art, this thick oxide 702 is etched. Using a photoresist mask this thick oxide 702 is etched, to a horizontal dimension size which is about, d, where, d, is the minimum process dimension. The dimension, d, is the smallest dimension which can be defined by the applicable photolithography techniques. The desired thin-oxide 701 can be regrown in the areas not covered by the remaining thick sacrificial oxide 702. According to one embodiment of the present invention, an inductively coupled plasma reactor (ICP) using $CHF_3$ may be employed for this etching as the same is disclosed in an article by N. R. Rueger et al., entitled "Selective etching of $SiO_2$ over polycrystalline silicon using $CHF_3$ in an inductively couples plasma reactor", J. Vac. Sci. Technol., A, 17(5), p. 2492–2502, 1999. Alternatively, a magnetic neutral loop discharge plasma can be used to etch the thick oxide 702 as disclosed in an article by W. Chen et al., entitled "Very uniform and high aspect ratio anisotropy $SiO_2$ etching process in magnetic neutral loop discharge plasma", ibid, p. 2546–2550. The latter is known to increase the selectivity of $SiO_2$ to photoresist and/or silicon. The structure is now as appears in FIG. 7A.

Figure 7B:
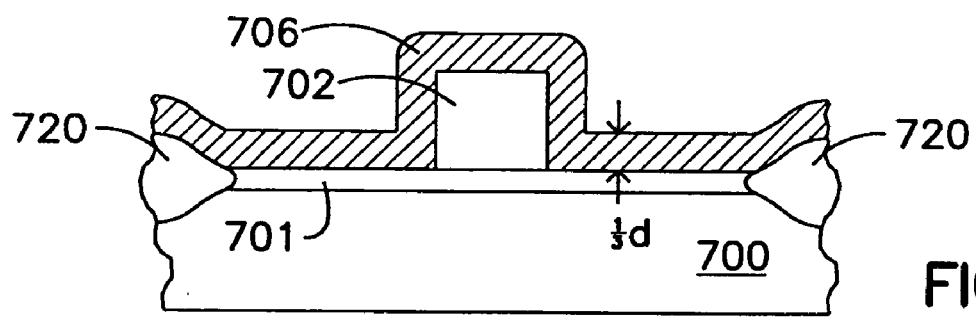

FIG. 7B illustrates the structure following the next sequence of fabrication steps. In FIG. 7B, a polysilicon layer 706 is deposited to a thickness of approximately ⅓ d. A conventional chemical vapor deposition (CVD) reactor may be used to deposit polycrystalline silicon films at substrate temperature in excess of 650° Celsius (C.). In an alternative embodiment, a plasma-enhanced CVD process (PECVD) can be employed if a lower thermal budget is desired. In another alternative embodiment, a microwave-excited plasma enhanced CVD of poly-silicon using $SiH_4$/Xe at temperature as low as 300° C. can be performed to deposit the polysilicon layer 406 as disclosed by Shindo et al., ibid. p. 3134–3138. According to this process embodiment, the resulting grain size of the polysilicon film was measured to be approximately 25 nm. Shindo et al. claim that the low-energy (approximately 3 eV), high-flux, ion bombardment utilizing Xe ions on a growing film surface activates the film surface and successfully enhances the surface reaction/migration of silicon, resulting in high quality film formation at low temperatures. In another alternative embodiment, the polysilicon layer 706 can be formed at an even lower temperature, e.g. 150° C., with and without charged species in an electron cyclotron resonance (ECR) plasma-enhanced CVD reactor as disclosed in an article by R. Nozawa et al., entitled "Low temperature polycrystalline silicon film formation with and without charged species in an electron cyclotron resonance $SiH_4$ plasma-enhanced chemical vapor deposition", ibid, p. 2542–2545. In this article, R. Nozawa et al. describe that in using an atomic force microscope they found that the films formed without charged species were smoother than those films formed with charged species. According to the teachings of the present invention, it is important to keep the smoothness of polysilicon layer 706. This will be evident from reading the subsequently described process steps in which another polysilicon layer will be fabricated later onto polysilicon layer 706 with a very thin insulation layer between them. The structure is now as appears in FIG. 7B.

Figure 7C:
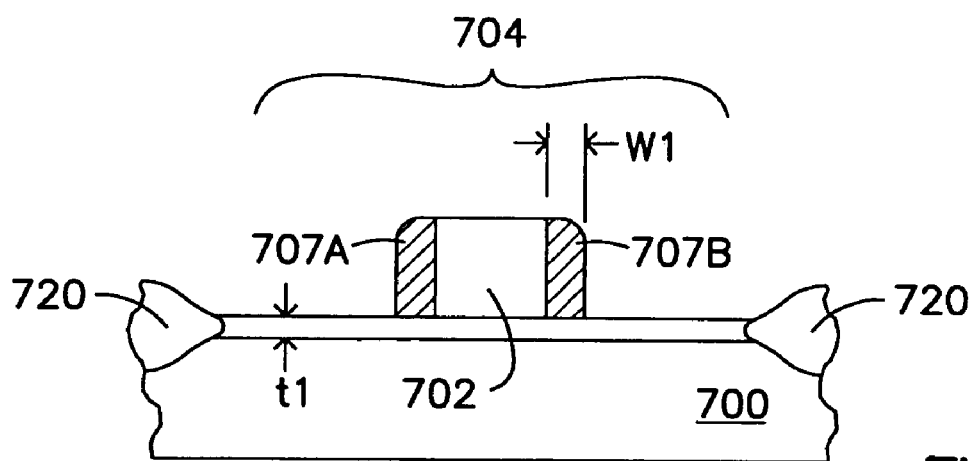

FIG. 7C illustrates the structure following the next sequence of processing steps. FIG. 7C shows a cross section of the resulting vertical gate structures, 707A and 707B, over the active device area 704 after the polysilicon layer 706 has been anisotropically etched. As shown in FIG. 7C, the polysilicon vertical gate structures, 707A and 707B, remain only at the sidewalls of the thick sacrificial oxide 702. In one embodiment, the polysilicon layer 706 is anisotropically etched such that the vertical gate structures, 707A and 707B remaining at the sidewalls of the thick sacrificial oxide 702 have a horizontal width (W1) of approximately 100 nanometers (nm). In one embodiment, the polysilicon layer 706 can be anisotropically etched to form the vertical gate structures, 707A and 707B, through the use of a high-density plasma helicon source for anisotropic etching of a dual-layer stack of poly-silicon on $Si_{1-x}Ge_x$ as described in an article by Vallon et al., entitled "Poly-silicon-germanium gate patterning studies in a high density plasma helicon source", J. Vac. Sci. Technol., A, 15(4), p. 1874–80, 1997. The same is incorporated herein by reference. In this article, wafers were described as being etched in a low pressure, high density plasma helicon source using various gas mixtures of $Cl_2$, HBr, and $O_2$. Also, according to this article, process conditions were optimized to minimize the gate oxide 701 consumption. The structure is now as shown in FIG. 7C.

Figure 7D:
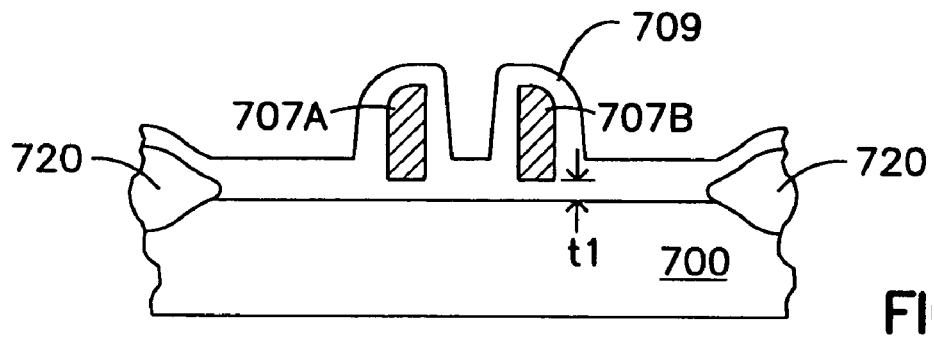

FIG. 7D illustrates the structure after the next series of process steps. In FIG. 7D, the thick sacrificial oxide 702 is removed. As one of ordinary skill in the art will understand upon reading this disclosure the thick sacrificial oxide layer 702 can be removed using any suitable, oxide selective etching technique. As shown in FIG. 7D, the remaining polysilicon vertical gate structures, 707A and 707B, are oxidized to form insulator, intergate dielectric, oxide layer, or silicon dioxide ($SiO_2$) layer 709. In one embodiment, a conventional thermal oxidation of silicon may be utilized at a high temperature, e.g. greater than 900° C. In an alternative embodiment, for purposes of maintaining a low thermal budget for advanced ULSI technology, a lower temperature process can be used. One such low temperature process includes the formation of high-quality silicon dioxide films by electron cyclotron resonance (ECR) plasma oxidation at temperature as low as 400° C. as described in an article by Landheer, D. et al., entitled "Formation of high-quality silicon dioxide films by electron cyclotron resonance plasma oxidation and plasma-enhanced chemical vapor deposition", Thin Solid Films, vol. 293, no. 1–2, p. 52–62, 1997. The same is incorporated herein by reference. Another such low temperature process includes a low temperature oxidation method using a hollow cathode enhanced plasma oxidation system as described in an article by Usami, K. et al., entitled "Thin Si oxide films for MIS tunnel emitter by hollow cathode enhanced plasma oxidation", Thin Solid Films, vol. 281–282, no. 1–2, p. 412–414, 1996. The same is incorporated herein by reference. Yet another low temperature process includes a low temperature VUV enhanced growth of thin silicon dioxide films at low temperatures below 400° C. as described in an article by Patel, P. et al., entitled "Low temperature VUV enhanced growth of thin silicon dioxide films", Applied Surface Science, vol. 46, p. 352–6, 1990. The same is incorporated herein by reference.

Figure 7E:
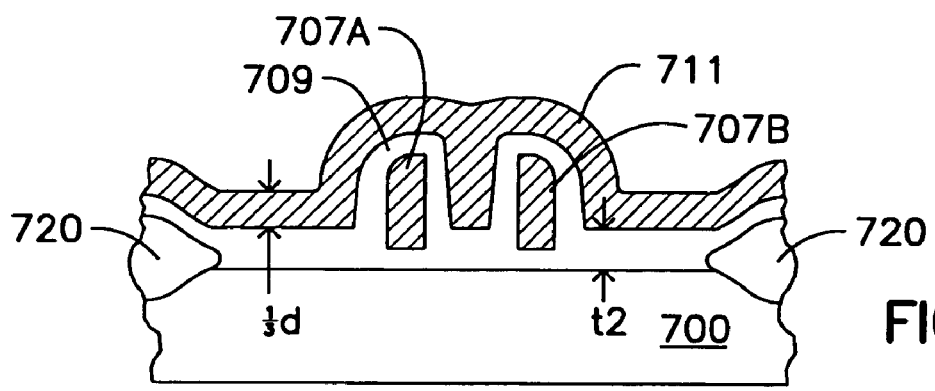

FIG. 7E shows the structure following the next series of steps. In FIG. 7E, another, or second, polysilicon layer 711 is formed over the oxide layer 709 to a thickness of approximately ⅓ d. In one embodiment the second polysilicon layer 711 has a thickness of approximately 100 nm. Forming the second polysilicon layer 711 over the oxide layer 709 can be performed using any similar technique to those used in forming the first polysilicon layer 706 as described in detail in connection with FIG. 7B. As shown in FIG. 7E, the second polysilicon layer 711 will be separated by a second oxide thickness, or second insulator thickness (t2) from the active device region 704 which is slightly greater than the thin tunnel oxide thickness, e.g. first oxide thickness or first insulator thickness (t1) which separates the vertical gate structures 707A and 707B from the substrate 700. In one embodiment the second oxide thickness, or second insulator material thickness (t2) is less than 350 Å thick. In one embodiment, the second oxide thickness (t2) is approximately 330 Angstroms (Å) thick. The structure is now as appears in FIG. 7E.

Figure 7F:
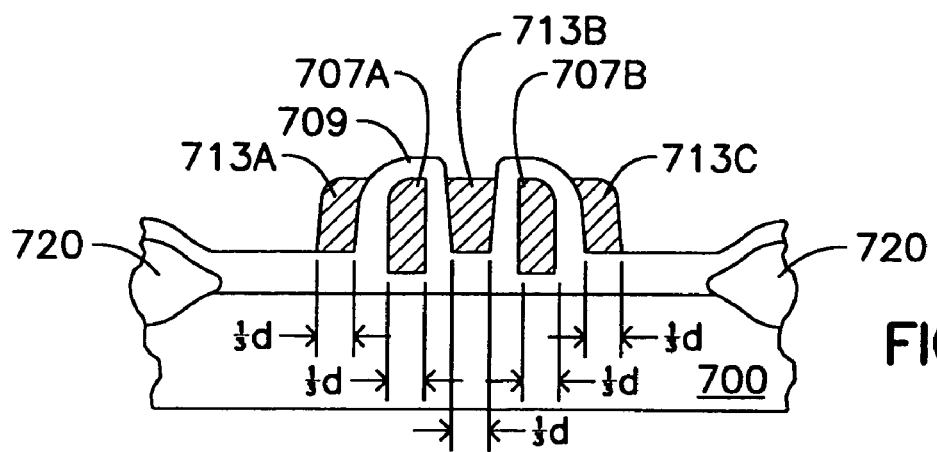

FIG. 7F illustrates the structure after the next series of steps. In FIG. 7F, the structure is once again subjected to an anisotropic etch. The anisotropic etch includes the anisotropic etching process used for etching the first polysilicon layer 706 to form the vertical gate structures 707A and 707B as described in more detail in connection with FIG. 7C. FIG. 7F shows one embodiment of the present invention in which the resulting structure is symmetrical, including a group of five free standing vertical polysilicon gates. The group of five free standing vertical gates include the original vertical gate structures 707A and 707B, and new vertical gate structures 713A, 713B, and 713C parallel to and on opposing sides of each original vertical gate structures 707A and 707B. This structure embodiment is now as appears in FIG. 7F. This can be followed by oxidation of the exposed polysilicon gates, 713A, 713B, and 713C. In one embodiment, the structure is oxidized to form an oxide layer of approximately 50 nm. The oxidation process of the structure can be performed using any suitable technique as the same has been describe above. An ion implantation is then performed to activate source and drain regions using standard techniques in CMOS process technology.

One of ordinary skill in the art will understand that other source and drain region configurations can be activated through various ion implantation techniques. Additionally, in one embodiment, the source and/or drain regions can be fabricated with source and/or drain extensions for facilitating tunneling, by using a masking step and another implantation as the same is known and understood by one of ordinary skill in the art. Also, according to the teachings of the present invention, other arrangements of gates, 707A, 707B, 713A, 713B, and 713C and different gate oxide thickness, t1 and t2, under the gates 707A, 707B, 713A, 713B, and 713C can be fabricated by variations on this process. The invention is not so limited.

Figure 8A:
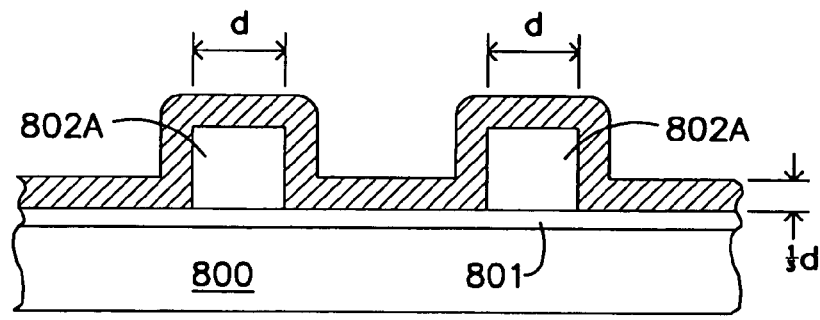
FIG. 8A–8D illustrate an embodiment of a variation on the fabrication process shown in FIGS. 7A–7F.
Figure 8B:
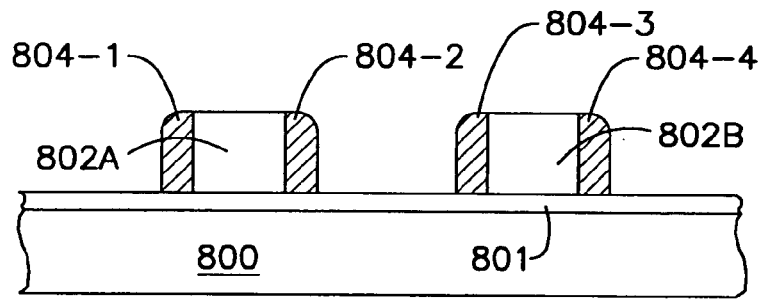
Figure 8C:
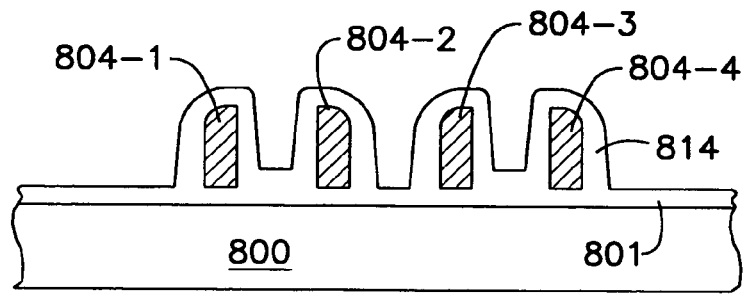
Figure 8D:
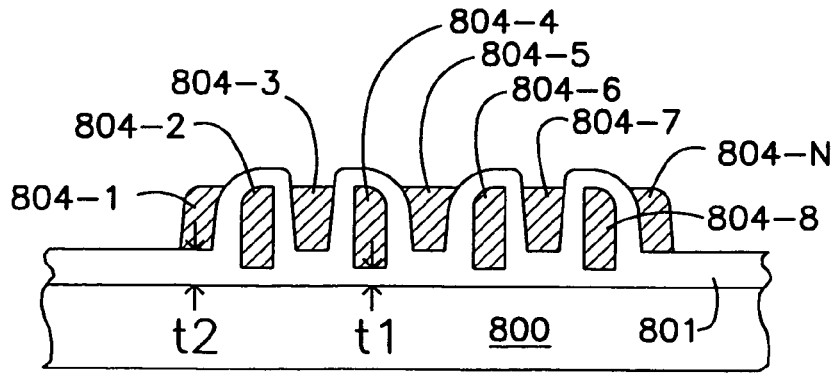

FIG. 8A–8D illustrates an embodiment of a variation on the fabrication process shown in FIGS. 7A–7F. FIG. 8A shows the use of adjacent thick CVD oxide structures, 802A and 802B, in the beginning steps of the process. As one of ordinary skill in the art will understand upon reading this disclosure, the adjacent thick CVD oxide structures, 802A and 802B, are formed according to the same process steps shown and described in detail in FIGS. 7A and 7B for forming a thick oxide layer 702 over thin gate oxide 701. The remaining process steps illustrated in FIGS. 8B–8D follow the same method shown and described in detail in connection with FIGS. 7C–7F to fabricate a long chain of vertical gates 804-1, 804-2, . . . , 804-N. This embodiment leaves a series of vertical gates 804-1, 804-2, . . . , 804-N with alternating thin (t1) and thick (t2) gate oxides. This structure embodiment is now as appears in FIG. 8D. Again, this can be followed by oxidation of the exposed polysilicon vertical gates 804-1, 804-3, . . . , 804-N. In one embodiment, the structure is oxidized to form an oxide layer of approximately 50 nm. The oxidation process of the structure can be performed using any suitable technique as the same has been describe above. An ion implantation is then performed to activate source and drain regions using standard techniques in CMOS process technology. As one of ordinary skill in the art will understand upon reading this disclosure, this process can be followed to produce a long chain of vertical gates 804-1, 804-2, . . . , 804-N above a horizontal depletion mode channel region and separating a single source and a single drain region.

Figure 9A:
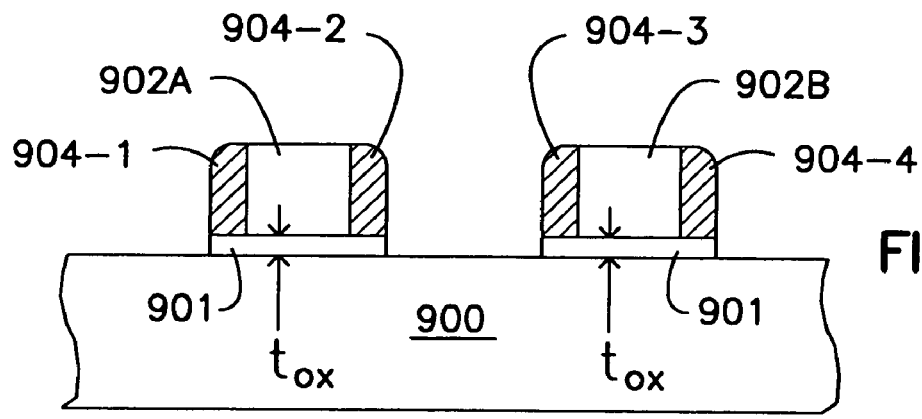
FIGS. 9A–9C illustrate another embodiment of a variation on the fabrication process to make all of the gates over thin gate oxides.
Figure 9B:
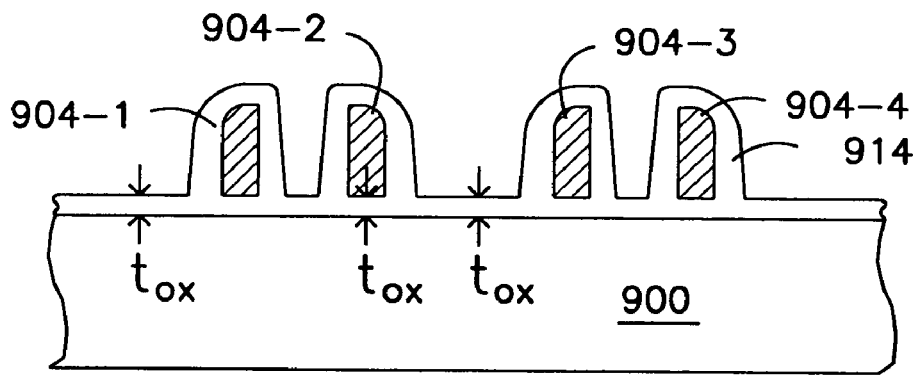
Figure 9C:
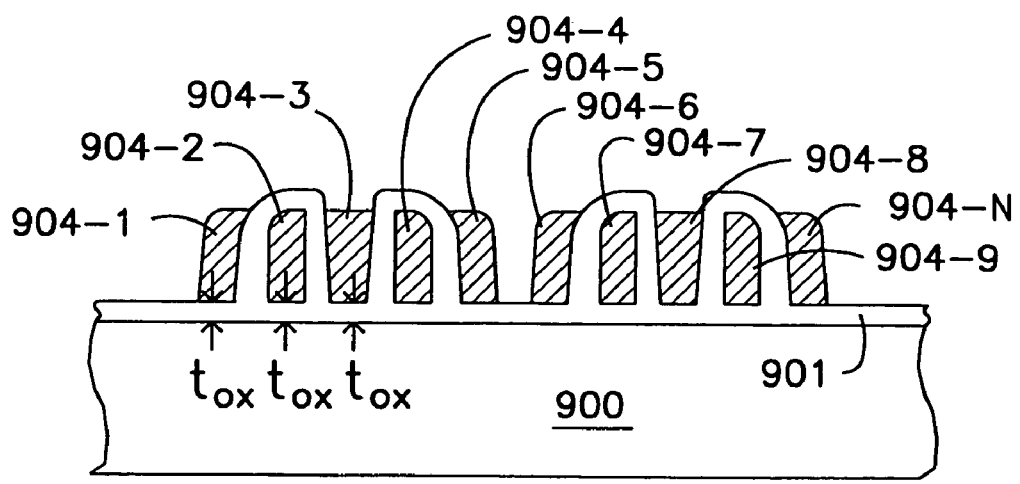

FIGS. 9A–9C illustrate another embodiment of a variation on the fabrication process to make all of the vertical gates over thin gate oxides. In the embodiment shown in FIG. 9A, the process outlined in FIGS. 7A–7F is changed in the process described in detail in connection with FIG. 7C. In FIG. 9A, the etch process described in FIG. 7C is performed to etch the polysilicon 706 anisotropically. This produces the structure shown in FIG. 9A with only thick oxide blocks 902A and 902B and polysilicon vertical gates 904-1, 904-2, . . . , 904-N separated from the horizontal depletion mode channel by thin gate oxide 901. Then the process is to etch portions of the gate oxide 701 over the silicon substrate 700 between the blocks of thick oxide 702. Next, as shown in FIG. 9B, the polysilicon vertical gates 904-1, 904-2, . . . , 904-N and the exposed substrate 900 are both oxidized according to the methods described in connection with FIG. 7D to give a thin gate oxide thickness (tox) on the substrate 900 equivalent to the thin gate oxide thickness (tox) beneath the thick oxides 902A and 902B and the polysilicon vertical gates 904-1, 904-2, . . . , 904-N. As one of ordinary skill in the art will understand upon reading this disclosure the process sequence can be completed as subsequently outlined in FIGS. 7E and 7F. The structure then appears as shown in FIG. 9C. In one embodiment, the structure is oxidized to form an oxide layer of approximately 50 nm. The oxidation process of the structure can be performed using any suitable technique as the same has been described above. An ion implantation is then performed to activate source and drain regions using standard techniques in CMOS process technology. As one of ordinary skill in the art will understand upon reading this disclosure, this process can be followed to produce a long chain of vertical polysilicon vertical gates 904-1, 904-2, . . . , 904-N above a horizontal depletion mode channel region separating a single source and a single drain region. The result in this embodiment is that all of the vertical polysilicon vertical gates 904-1, 904-2, . . . , 904-N will be over a thin gate oxide (tox). In other words, in this embodiment, all of the polysilicon vertical gates 904-1, 904-2, . . . , 904-N will be active gates able to control conduction in the horizontal depletion mode channel beneath the polysilicon vertical gates 904-1, 904-2, . . . , 904-N.

Figure 10A:
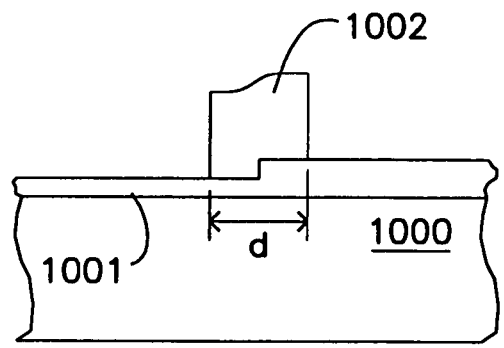
FIGS. 10A–10D illustrate another embodiment of a variation on the fabrication process to allow the fabrication of different gate oxide thicknesses under various gates to make some lines active and others as passing lines.
Figure 10B:
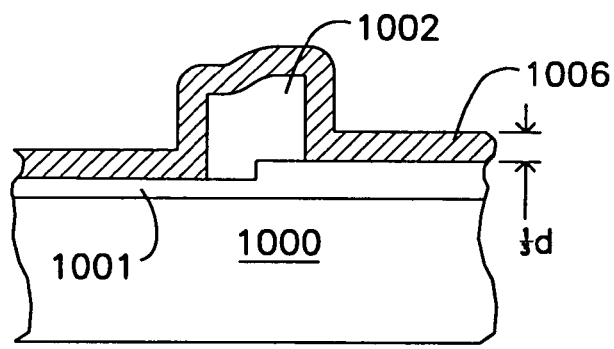
Figure 10C:
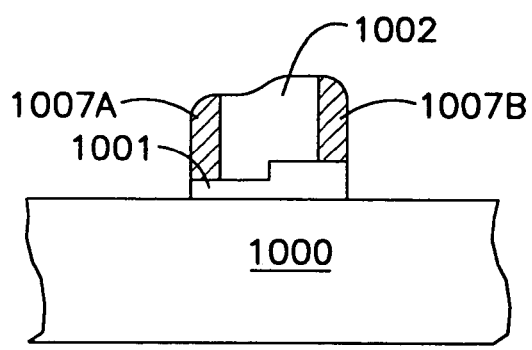
Figure 10D:
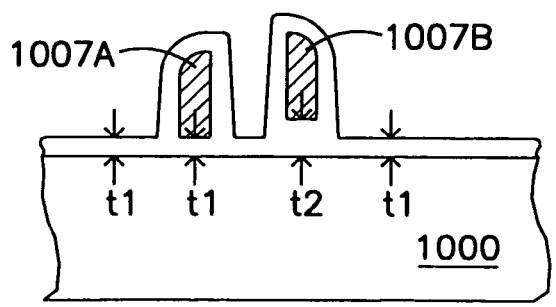

FIGS. 10A–10C illustrate another embodiment of a variation on the fabrication process to allow the fabrication of different gate oxide thicknesses under various gates to make some lines active and others as passing lines. In other words, FIGS. 10A–10C outline a technique to make some of the original gates over thin gate oxide (t1) and others over the thicker gate oxide (t2). As shown in FIG. 10A, the thick oxide 1002 is deposited over a step in the gate oxide thickness 1001 which has a thickness of both (t1) and (t2). The process then follows the same as outlined in connection with FIG. 7A and 7B. In FIG. 10C, however, the etching process described in FIG. 7C is performed not only to etch the polysilicon 706 anisotropically, but then to also etch portions of the gate oxide 701 over the silicon substrate 700 outside of the block of thick oxide 702. This produces the structure shown in FIG. 10C. Next, the exposed silicon substrate 1000 and the polysilicon gates 1007A and 1007B are oxidized to form an oxide layer which has a thickness equivalent to the thin gate oxide thickness (t1). The structure is now as appears in FIG. 10D. In one embodiment, the thin gate oxide has a thickness (t1) of less than 50 Å. In one embodiment, the thin gate oxide has a thickness (t1) of approximately 33 Å. The oxidation process of the structure can be performed using any suitable technique as the same has been described above. As shown in FIG. 10D, this results in a structure where vertical polysilicon gate 1007A is over a thin gate oxide (t1) and vertical polysilicon gate 1007B is over a thick gate oxide (t2). As one of ordinary skill in the art will understand upon reading this disclosure, this process can be followed to produce a long chain of vertical polysilicon vertical gates. In one embodiment, any additional adjacent vertical polysilicon gates can be formed over the thin gate oxide (t1) such that only one vertical gate serves as a passing line. Otherwise, the described process can be repeated in the same fashion such that multiple passing lines are formed. An ion implantation is then performed to activate source and drain regions using standard techniques in CMOS process technology.

In still an alternative embodiment of FIG. 10D the exposed silicon substrate 1000 of FIG. 10C and the polysilicon gates 1007A and 1007B can be oxidized to form an oxide layer which has a thickness equivalent to the thick, or second gate oxide thickness (t2). This will result in one vertical polysilicon gate over a thin gate oxide, or first gate oxide, thickness (t1) and one vertical polysilicon gate and any additional vertical polysilicon gates over the thicker, or second gate oxide, thickness (t2). As one of ordinary skill in the art will understand upon reading this disclosure, this process can be followed to produce a long chain of vertical polysilicon vertical gates. In one embodiment, any additional adjacent vertical polysilicon gates can be formed over the thicker, or second gate oxide thickness (t2) such that only one vertical gate serves as a active input. Otherwise, the described process can be repeated in the same fashion such that multiple active inputs are formed.

As one of ordinary skill in the art will understand upon reading this disclosure, an ion implantation is then performed to activate source and drain regions using standard techniques in CMOS process technology. This will result in multiple vertical polysilicon gates above a horizontal depletion mode channel region separating a single source and a single drain region according to the teachings of the present invention. In the embodiment, described in FIGS. 10A–10D vertical polysilicon gate 1007A will be an active gate which is able to control the conduction in the horizontal depletion mode channel and vertical polysilicon gate 1007B will be a passing line which does not effect conduction in the horizontal depletion mode channel.

One of ordinary skill in the art will understand upon reading this disclosure, that by a combination of the process methods described in FIGS. 7–11, and other variations, that a series of vertical polysilicon gates with a wide variety of gate oxide thickness combinations can be formed. Some of the vertical polysilicon gates over a thin, or first, gate oxide thickness (t1) will serve as active gates and others of the vertical polysilicon gates over a thicker, or second, gate oxide thickness all between a single source and drain region will act as passing lines.

According to the teachings of the present invention, if all of the multiple vertical gates are input lines then less than one MOSFET transistor would be required per logic input. The vertical gates formed above a thin, first oxide, thickness (t1) will be active inputs such that their gate voltages can control the channel conductivity in the horizontal depletion mode channel. Conversely, the vertical gates formed above a thicker, second oxide, thickness (t2) will be passing lines such that their gate voltages can not control the channel conductivity. In one embodiment, according to the teachings of the present invention, if the active gates are at their most negative potential where VGS is less than VT then this particular region of the channel will not be turned on and will not conduct. The action of the gates, if addressed with the most positive logic input voltage which in one embodiment will be zero volts, is to turn the portion of the channel beneath the vertical gate "on." Thus, a number of logic circuits, such as a NAND circuit, can be formed according to the teachings of the present invention. Unless all the active inputs are in such a state to allow conduction, their most positive voltage, no signal will propagate through the horizontal depletion mode channel underneath the chain of vertical gates.

Figure 11A:
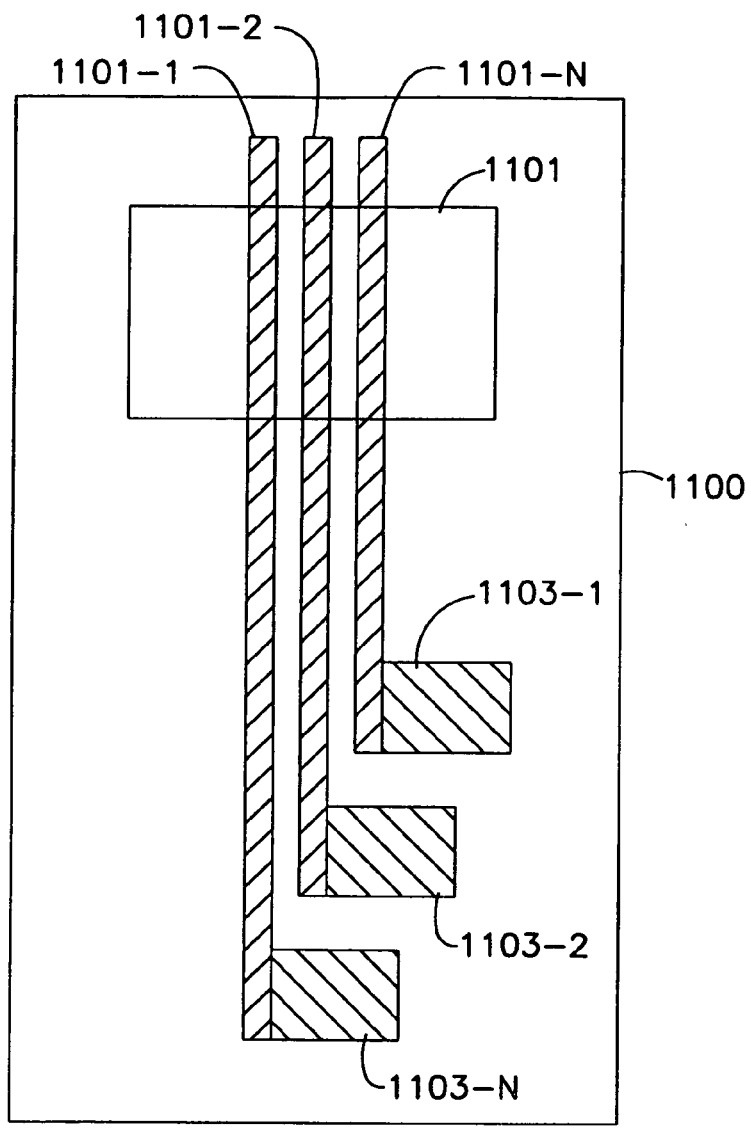
FIGS. 11A and 11B are an illustration of an embodiment in which a number of input lines which collectively pass over multiple MOSFET logic cells is a logic circuit block, can be contacted at the edge of a logic circuit according to the teachings of the present invention.
Figure 11B:
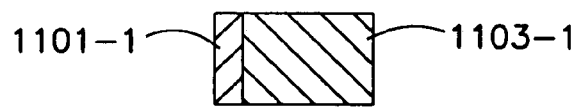

FIG. 11 is an illustration of an embodiment in which a number of input lines 1101-1, 1101-2, ..., 1101-N, which collectively pass over multiple MOSFET logic cells in a programmable logic array represented by PLA circuit block 1101, can be contacted at the edge of a PLA 1100 according to the teachings of the present invention. As shown in FIG. 11 the input lines, or vertical gate lines 1101-1, 1101-2, ..., 1101-N run up beside a conductive block of polysilicon or other conductor, shown as 1103-1, 1103-2, ..., 1103-N, at the edge of a PLA 1100. The PLA 1100 includes, but is not limited to, the PLA described and explained in detail in connection with FIG. 6. FIG. 11 thus represents one embodiment in which multiple vertical gate or input lines 1101-1, 1101-2, ..., 1101-N, which have sub-lithographic dimensions and pass over single MOSFET logic cells can be contacted to independent potential sources to perform a multitude of logic functions.

Figure 12:
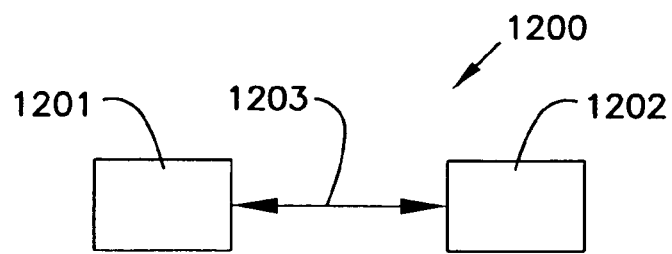
FIG. 12 illustrates a block diagram of an embodiment of an electronic system according to the teachings of the present invention.

FIG. 12 illustrates a block diagram of an embodiment of an electronic system 1200 according to the teachings of the present invention. In the embodiment shown in FIG. 12, the system 1200 includes a processor which includes a PLA 1201. The PLA has an array of logic cells formed according to the teachings of the present invention. PLA is coupled to a memory device 1202 by a bus 1203. In one embodiment, the memory device 1202 and the processor device with its PLA 1201 are located on a single chip.

It will be understood that the embodiment shown in FIG. 12 illustrates an embodiment for electronic system circuitry in which the novel static pass transistors, or logic cells of the present invention are included. One of ordinary skill in the art will understand upon reading this disclosure that the PLA of the present invention can equally be used in a variety of applications, the invention is not so limited. The illustration of system 1200, as shown in FIG. 12, is intended to provide a general understanding of one application for the structure and circuitry of the present invention, and is not intended to serve as a complete description of all the elements and features of an electronic system using the novel logic cell structures.

Applications containing the novel PLA of the present invention as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

The Figures presented and described in detail above are similarly useful in describing the method embodiments of operation for a novel PLA of the present invention. That is one embodiment of the present invention includes a method for operating a PLA. The method includes applying a number of input signals to a number of logic cells in a first logic plane. Each logic cell includes a source region, a drain region, a depletion mode channel region therebetween, and a number of vertical gates located above different portions of the depletion mode channel region. At least one of the vertical gates is separated from the depletion mode channel by a first oxide thickness and at least one of the vertical gates is separated from the depletion mode channel by a second oxide thickness. According to the teachings of the present invention, applying a number of input signals to the number of logic cells in the first logic plane includes applying a potential to the number of vertical gates in each logic cell.

This method embodiment further includes outputting a number of output signals from the first logic plane to a number of logic cells in a second logic plane. Each logic cell in the second logic plane includes a source region, a drain region, a depletion mode channel region therebetween, and a number of vertical gates located above different portions of the depletion mode channel region. At least one of the vertical gates is separated from the depletion mode channel by a first oxide thickness and at least one of the vertical gates is separated from the depletion mode channel by a second oxide thickness. Outputting a number of output signals from the first logic plane to a number of logic cells in a second logic plane includes applying a potential to the number of vertical gates for the logic cells in the second logic plane. The number of logic cells in the second logic plane are arranged in rows and columns to receive the output signals from the first logic plane and are interconnected to produce a number of logical outputs such that the programmable logic array implements a logical function.

According to the teachings of the present invention, applying a potential to the number of vertical gates includes applying the potential to a number of active inputs for each logic cell. In one embodiment, applying the potential to the number of active inputs controls conduction in the depletion mode channel such that each logic cell functions as a NAND gate. In one embodiment, applying the potential to the number of active inputs includes applying a negative potential of approximately −0.6 Volts to at least one of the active inputs such that the active input turns off conduction in the depletion mode channel. Similarly, according to the teachings of the present invention, applying a potential to the number of vertical gates includes applying the potential to a number of passing lines.

In one embodiment of the present invention a method for operating a programmable logic array includes applying a number of input signals to a number of logic cells in a first logic plane. Applying a number of input signals to the number of logic cells in the first logic plane includes applying a potential to a number of vertical gates located above different portions of a horizontal depletion mode channel. At least one of the vertical gates is separated from the depletion mode channel by a first oxide thickness and at least one of the vertical gates is separated from the depletion mode channel by a second oxide thickness. A number of output signals are outputted from the first logic plane to a number of logic cells in a second logic plane. Outputting the number of output signals from the first logic plane to the number of logic cells in the second logic plane includes applying a potential to a number of vertical gates located above different portions of a horizontal depletion mode channel. Again, at least one of the vertical gates is separated from the depletion mode channel by a first oxide thickness and at least one of the vertical gates is separated from the depletion mode channel by a second oxide thickness. The number of logic cells in the second logic plane are arranged in rows and columns to receive the output signals of the first logic plane and are interconnected to produce a number of logical outputs such that the programmable logic array implements a logical function. This method embodiment includes using at least one of the number of vertical gates in any logic cell as a passing line such that a potential on the passing line does not effect conduction in the depletion mode channel. This method embodiment further includes using at least two of the number of vertical gates in any logic cell as a number of active inputs such that the active inputs control conduction in the depletion mode channel.

According to the teachings of the present invention the method further includes independently applying potential values to the number of vertical gates. Independently applying potential values to the number of vertical gates includes performing a logic function. In one embodiment, performing a logic function includes performing a NAND logic function. In one embodiment, using at least two of the number of vertical gates in any logic cell as a number of active inputs includes applying a negative potential to the active inputs of approximately −0.6 Volts to turn off conduction in the depletion mode channel region. Also, using at least one of the number of vertical gates in any logic cell as a passing line includes using at least one of the number of vertical gates separated from the depletion mode channel by the second oxide thickness as the passing line, wherein the second oxide thickness is greater than the first oxide thickness.

According to the teachings of the present invention, applying a potential to a number of vertical gates located above different portions of a horizontal depletion mode channel includes applying the potential to a number of edge defined vertical gates such that the vertical gates have a horizontal width which is sub-lithographic in dimension. Applying the potential to a number of edge defined vertical gates such that the vertical gates have a horizontal width which is sub-lithographic in dimension includes using less than one MOSFET for a number of logic inputs in each logic cell of the programmable logic array.

CONCLUSION

Thus, the present invention provides systems and methods for vertical gate transistors in static pass transistor programmable logic arrays. The vertical gate transistors have multiple vertical gates which are edge defined such that only a single transistor is required for multiple logic inputs. According to the present invention, there is no source nor drain region associated with each input and the gates have sub-lithographic horizontal dimensions by virtue of being edge defined vertical gates. Thus, a minimal surface area is required for each logic input.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A method for operating a programmable logic array, comprising:

applying a number of input signals to a number of logic cells in a first logic plane, wherein each logic cell includes a source region, a drain region, a depletion mode channel region therebetween, and a number of vertical gates located above different portions of the depletion mode channel region, wherein at least one of the vertical gates is separated from the depletion mode channel by a first oxide thickness, wherein at least one of the vertical gates is separated from the depletion mode channel by a second oxide thickness, and wherein applying a number of input signals to the number of logic cells in the first logic plane includes applying a potential to the number of vertical gates in each logic cell;

outputting a number of output signals from the first logic plane to a number of logic cells in a second logic plane, wherein each logic cell in the second logic plane includes a source region, a drain region, a depletion mode channel region therebetween, and a number of vertical gates located above different portions of the depletion mode channel region, wherein at least one of the vertical gates is separated from the depletion mode channel by a first oxide thickness, wherein at least one of the vertical gates is separated from the depletion mode channel by a second oxide thickness, and wherein outputting a number of output signals from the first logic plane to a number of logic cells in a second logic plane includes applying a potential to the number of vertical gates for the logic cells in the second logic plane; and wherein the number of logic cells in the second logic plane are arranged in rows and columns to receive the output signals from the first logic plane and are interconnected to produce a number of logical outputs such that the programmable logic array implements a logical function.

2. The method of claim 1, wherein applying a potential to the number of vertical gates includes applying the potential to a number of active inputs for each logic cell.

3. The method of claim 2, wherein applying the potential to the number of active inputs controls conduction in the depletion mode channel such that each logic cell functions as a NAND gate.

4. The method of claim 2, wherein applying the potential to the number of active inputs includes applying a negative potential of approximately −0.6 Volts to at least one of the active inputs such that the active input turns off conduction in the depletion mode channel.

5. The method of claim 1, wherein applying a potential to the number of vertical gates includes applying the potential to a number of passing lines.

6. A method for operating a programmable logic array, comprising:

applying a number of input signals to a number of logic cells in a first logic plane, wherein applying a number of input signals to the number of logic cells in the first logic plane includes applying a potential to a number of vertical gates located above different portions of a horizontal depletion mode channel, wherein at least one of the vertical gates is separated from the depletion mode channel by a first oxide thickness, and wherein at least one of the vertical gates is separated from the depletion mode channel by a second oxide thickness;

outputting a number of output signals from the first logic plane to a number of logic cells in a second logic plane, wherein outputting the number of output signals from the first logic plane to the number of logic cells in the second logic plane includes applying a potential to a number of vertical gates located above different portions of a horizontal depletion mode channel, wherein at least one of the vertical gates is separated from the depletion mode channel by a first oxide thickness, and wherein at least one of the vertical gates is separated from the depletion mode channel by a second oxide thickness;

wherein the number of logic cells in the second logic plane are arranged in rows and columns to receive the output signals of the first logic plane and are interconnected to produce a number of logical outputs such that the programmable logic array implements a logical function;

using at least one of the number of vertical gates in any logic cell as a passing line such that a potential on the passing line does not effect conduction in the depletion mode channel; and using at least two of the number of vertical gates in any logic cell as a number of active inputs such that the active inputs control conduction in the depletion mode channel.

7. The method of claim 6, wherein the method further includes independently applying potential values to the number of vertical gates.

8. The method of claim 7, wherein independently applying potential values to the number of vertical gates includes performing a logic function.

9. The method of claim 8, wherein performing a logic function includes performing a NAND logic function.

10. The method of claim 6, wherein using at least two of the number of vertical gates in any logic cell as a number of active inputs includes applying a negative potential to the active inputs of approximately −0.6 Volts to turn off conduction in the depletion mode channel region.

11. The method of claim 6, wherein using at least one of the number of vertical gates in any logic cell as a passing line includes using at least one of the number of vertical gates separated from the depletion mode channel by the second oxide thickness as the passing line, wherein the second oxide thickness is greater than the first oxide thickness.

12. The method of claim 6, wherein applying a potential to a number of vertical gates located above different portions of a horizontal depletion mode channel includes applying the potential to a number of edge defined vertical gates such that the vertical gates have a horizontal width which is sub-lithographic in dimension.

13. The method of claim 12, wherein applying the potential to a number of edge defined vertical gates such that the vertical gates have a horizontal width which is sub-lithographic in dimension includes using less than one MOSFET for a number of logic inputs in each logic cell of the programmable logic array.

14. A method for operating a programmable logic array, comprising:

applying a first plurality of input signals to a second plurality of logic cells in a first logic plane, wherein each logic cell includes a source region, a drain region, a depletion region therebetween, and a third plurality of vertical gates disposed above the depletion region;

wherein each individual one of the third plurality of vertical gates is separated from the depletion region by an individual dielectric thickness selected to be one of, a first thickness to controllably turn off the depletion region upon application of an input signal to the vertical gate, and a second thickness to not turn off the horizontal depletion region upon application of an input signal to the vertical gate;

wherein applying the first plurality of input signals to the second plurality of logic cells includes applying the first plurality of input signals to the third plurality of vertical gates to implement a logic function and produce a fourth plurality of signals;

outputting the fourth plurality of signals from the first logic plane as input signals to a fifth plurality of logic cells in a second logic plane, wherein each logic cell includes a source region, a drain region, a depletion region therebetween, and a sixth plurality of vertical gates disposed above the depletion region;

wherein each individual one of the sixth plurality of vertical gates is separated from the depletion region by an individual dielectric thickness selected to be one of, a third thickness to controllably turn off the depletion region upon application of an input signal to the vertical gate, and a fourth thickness to not turn off the horizontal depletion region upon application of an input signal to the vertical gate;

wherein applying the fourth plurality of input signals to the fifth plurality of logic cells includes applying the fourth plurality of input signals to the sixth plurality of vertical gates to implement a logic function.

15. The method for operating a programmable logic array of claim 14, wherein the second plurality of logic cells in the first logic plane are arranged in rows and columns to receive the first plurality of input signals and are interconnected to produce a number of logical outputs for the second logic array.

16. The method for operating a programmable logic array of claim 14, wherein the second plurality of logic cells in the second logic plane are arranged in rows and columns to receive the fourth plurality of input signals from the first logic plane and are interconnected to produce a number of logical outputs such that the programmable logic array implements a logical function.

17. A method for operating a programmable logic array, comprising:

applying a first plurality of input signals to a second plurality of logic cells in a first logic plane, wherein each logic cell includes a source region, a drain region, a depletion region therebetween, and a third plurality of vertical gates disposed above the depletion region;

wherein each individual one of the third plurality of vertical gates is separated from the depletion region by an individual dielectric thickness selected to be one of, a first thickness to controllably turn off the depletion region upon application of an input signal to the vertical gate, and a second thickness to not turn off the horizontal depletion region upon application of an input signal to the vertical gate;

wherein applying the first plurality of input signals to the second plurality of logic cells includes applying the first plurality of input signals to the third plurality of vertical gates to implement a logic function and produce a fourth plurality of signals;

outputting the fourth plurality of signals from the first logic plane as input signals to a fifth plurality of logic cells in a second logic plane, wherein each logic cell includes a source region, a drain region, a depletion region therebetween, and a sixth plurality of vertical gates disposed above the depletion region;

wherein each individual one of the sixth plurality of vertical gates is separated from the depletion region by an individual dielectric thickness selected to be one of, a third thickness to controllably turn off the depletion region upon application of an input signal to the vertical gate, and a fourth thickness to not turn off the horizontal depletion region upon application of an input signal to the vertical gate;

wherein applying the fourth plurality of input signals to the fifth plurality of logic cells includes applying the fourth plurality of input signals to the sixth plurality of vertical gates to implement a logic function; and wherein individual ones of the second plurality of logic cells in the first logic plane are programmed to be logically inactive by selecting the individual dielectric thickness of everyone of the third plurality of vertical gates to be the second thickness to not turn off the horizontal depletion region upon application of an input signal.

18. The method for operating a programmable logic array of claim 17, wherein individual ones of the fifth plurality of logic cells in the second logic plane are programmed to be logically inactive by selecting the individual dielectric thickness of everyone of the sixth plurality of vertical gates to be the fourth thickness to not turn off the horizontal depletion region upon application of an input signal.

19. The method for operating a programmable logic array of claim 17, wherein applying the first plurality of input signals to the third plurality of vertical gates includes applying a potential to more than one of the third plurality of vertical gates.

20. The method for operating a programmable logic array of claim 17, wherein each one of the second plurality of logic cells includes at least two of the third plurality of vertical gates with an individual dielectric thickness selected to controllably turn off the depletion region upon application of the input signal.

21. A method for operating a programmable logic array, comprising:

applying a first plurality of input signals to a second plurality of logic cells in a first logic plane, wherein each logic cell includes a source region, a drain region, a depletion region therebetween, and a third plurality of vertical gates disposed above the depletion region;

wherein each individual one of the third plurality of vertical gates is separated from the depletion region by an individual dielectric thickness selected to be one of, a first thickness to controllably turn off the depletion region upon application of an input signal to the vertical gate, and a second thickness to not turn off the horizontal depletion region upon application of an input signal to the vertical gate;

wherein applying the first plurality of input signals to the second plurality of logic cells includes applying the first plurality of input signals to the third plurality of vertical gates to implement a logic function and produce a fourth plurality of signals;

outputting the fourth plurality of signals from the first logic plane as input signals to a fifth plurality of logic cells in a second logic plane, wherein each logic cell includes a source region, a drain region, a depletion region therebetween, and a sixth plurality of vertical gates disposed above the depletion region;

wherein each individual one of the sixth plurality of vertical gates is separated from the depletion region by an individual dielectric thickness selected to one of, a third thickness to controllably turn off the depletion region upon application of an input signal to the vertical gate, and a fourth thickness to not turn off the horizontal depletion region upon application of an input signal to the vertical gate;

wherein applying the fourth plurality of input signals to the fifth plurality of logic cells includes applying the fourth plurality of input signals to the sixth plurality of vertical gates to implement a logic function; and wherein each one of the fifth plurality of logic cells includes at least two of the sixth plurality of vertical gates with an individual dielectric thickness selected to be the third thickness to controllably turn off the depletion region upon application of the input signal to the vertical gate.

22. The method for operating a programmable logic array of claim 21, wherein each of the fourth plurality of output signals from the first logic plane are applied to output amplifier circuits before inputting the fourth plurality of output signals to the fifth plurality of logic cells in the second logic plane.

23. The method for operating a programmable logic array of claim 21, wherein each of the fourth plurality of output signals from the first logic plane are applied to level shift circuits before inputting the fourth plurality of output signals to the fifth plurality of logic cells in the second logic plane.

24. The method for operating a programmable logic array of claim 21, wherein at least some of the second plurality of logic cells in the first logic plane are arranged such that the application of the first plurality of input signals results in the logic cell functioning as a NAND logic gate.

25. The method for operating a programmable logic array of claim 21, wherein applying the first plurality of input signals to the second plurality of logic cells in the first logic plane includes applying a signal having a negative potential of approximately six tenths of a volt.

26. The method for operating a programmable logic array of claim 25, wherein the individual dielectric thickness selected to controllably turn off the depletion region upon application of an input signal is less than 5 nanometers.

27. The method for operating a programmable logic array of claim 25, wherein the individual dielectric thickness selected to not turn off the depletion region upon application of an input signal is approximately 30 nanometers.

28. A method for operating a programmable logic array, comprising:
applying a first plurality of input signals to a second plurality of logic cells in a first logic plane, wherein each logic cell includes a source region, a drain region, a depletion region therebetween, and a third plurality of vertical gates disposed above the depletion region;
wherein each individual one of the third plurality of vertical gates is separated from the depletion region by an individual dielectric thickness selected to be one of, a first thickness to controllably turn off the depletion region upon application of an input signal to the vertical gate, and a second thickness to not turn off the horizontal depletion region upon application of an input signal to the vertical gate;
wherein applying the first plurality of input signals to the second plurality of logic cells includes applying the first plurality of input signals to the third plurality of vertical gates to implement a logic function and produce a fourth plurality of signals;
outputting the fourth plurality of signals from the first logic plane as input signals to a fifth plurality of logic cells in a second logic plane, wherein each logic cell includes a source region, a drain region, a depletion region therebetween, and a sixth plurality of vertical gates disposed above the depletion region;
wherein each individual one of the sixth plurality of vertical gates is separated from the depletion region by an individual dielectric thickness selected to be one of, a third thickness to controllably turn off the depletion region upon application of an input signal to the vertical gate, and a fourth thickness to not turn off the horizontal depletion region upon application of an input signal to the vertical gate;
wherein applying the fourth plurality of input signals to the fifth plurality of logic cells includes applying the fourth plurality of input signals to the sixth plurality of vertical gates to implement a logic function; and
wherein each individual one of the third plurality of vertical gates in each logic cell is disposed over a different portion of the depletion region.

29. The method for operating a programmable logic array of claim 28, wherein the logic cell includes four vertical gates, each vertical gate separated from the depletion region by the first individual dielectric thickness selected to controllably turn off the depletion region upon application of an input signal, and arranged so that the logic cell performs the logic function of a positive logic four input NAND gate.

30. The method for operating a programmable logic array of claim 28, wherein applying the first plurality of input signals to the second plurality of logic cells in the first logic plane includes applying input signals to selected ones of the third plurality of vertical gates, wherein the third plurality of vertical gates comprise edge defined conductive material having a horizontal width which is sub-lithographic in dimension.

31. The method for operating a programmable logic array of claim 30, wherein the conductive material comprises doped polycrystalline silicon.

32. A method for operating a programmable logic array, comprising:
applying a first plurality of input signals to a second plurality of logic cells in a first logic plane, wherein each logic cell includes a source region, a drain region, a depletion region therebetween, and a third plurality of vertical gates disposed above the depletion region;
wherein each individual one of the third plurality of vertical gates is separated from the depletion region by an individual dielectric thickness selected to be one of, a first thickness to controllably turn off the depletion region upon application of an input signal to the vertical gate, and a second thickness to not turn off the horizontal depletion region upon application of an input signal to the vertical gate;
wherein applying the first plurality of input signals to the second plurality of logic cells includes applying the first plurality of input signals to the third plurality of vertical gates to implement a logic function and produce a fourth plurality of signals;
outputting the fourth plurality of signals from the first logic plane as input signals to a fifth plurality of logic cells in a second logic plane, wherein each logic cell includes a source region, a drain region, a depletion region therebetween, and a sixth plurality of vertical gates disposed above the depletion region;
wherein each individual one of the sixth plurality of vertical gates is separated from the depletion region by an individual dielectric thickness selected to be one of, a third thickness to controllably turn off the depletion region upon application of an input signal to the vertical gate, and a fourth thickness to not turn off the horizontal depletion region upon application of an input signal to the vertical gate;
wherein applying the fourth plurality of input signals to the fifth plurality of logic cells includes applying the fourth plurality of input signals to the sixth plurality of vertical gates to implement a logic function; and
wherein applying the fourth plurality of output signals to the fifth plurality of logic cells in the second logic plane includes applying the signals to selected ones of the sixth plurality of vertical gates, wherein the sixth plurality of vertical gates comprise edge defined conductive material having a horizontal width which is sub-lithographic in dimension.

33. The method for operating a programmable logic array of claim 32, wherein each individual one of the third and the sixth pluralities of vertical gates is separated from others of the third and the sixth plurality of vertical gates by a dielectric layer.

34. The method for operating a programmable logic array of claim 33, wherein the dielectric material comprises thermally grown silicon dioxide.

35. The method for operating a programmable logic array of claim 32, wherein the pluralities of vertical gates are disposed in parallel to one another.

36. The method for operating a programmable logic array of claim 35, wherein each one of the pluralities of vertical gates are approximately one hundred nanometers wide and approximately 500 nanometers high.

37. A method for operating a programmable logic array, comprising:

at least one row of logic cells in a first logic plane, wherein each individual logic cell includes at least a first and a second gate disposed to accept signal potentials;

wherein each of the at least first and second gates of the logic cell are separated from a depletion conduction region connecting a source diffusion and a drain diffusion of the logic cell by either a first dielectric thickness to turn off at least a region of the depletion region upon application of a signal potential to the first or second gate, or a second dielectric thickness to not turn off any region of the depletion region upon application of the signal potential to the first or second gate;

applying a first input signal potential to the first gate of the logic cell and a second input signal potential to the second gate of the logic cell to produce at least one logical function output of the first logic plane.

38. The method for operating a programmable logic array of claim 37, wherein further at least one row of logic cells in a second logic plane are arranged to accept as an input the at least one logical function output of the first logic plane;

wherein each individual logic cell of the second logic plane includes at least a third and a fourth gate are separated from a depletion conduction region connecting a source diffusion and a drain diffusion of the logic cells of the second logic plane by either a third dielectric thickness to turn off at least a region of the depletion region upon application of a signal potential to the third or fourth gate, or a fourth dielectric thickness to not turn off any region of the depletion region upon application of the signal potential to the third or fourth gate.

39. The method for operating a programmable logic array of claim 38, wherein further applying a third input signal potential to the third gate of the logic cell and a fourth input signal potential to the fourth gate of the logic cell produces at least one logical function output of the second logic plane.

* * * * *